US010131810B2

(12) United States Patent
Matsuo et al.

(10) Patent No.: US 10,131,810 B2
(45) Date of Patent: Nov. 20, 2018

(54) ACTIVE ENERGY-RAY-CURABLE RESIN COMPOSITION FOR COATING ORGANIC OR INORGANIC SUBSTRATE

(71) Applicant: Kaneka Corporation, Osaka (JP)

(72) Inventors: Youichi Matsuo, Hyogo (JP); Atsushi Tsukao, Hyogo (JP)

(73) Assignee: Kancka Corporation, Osaka (JP)

( * ) Notice: Subject to any disclaimer, the term of this patent is extended or adjusted under 35 U.S.C. 154(b) by 322 days.

(21) Appl. No.: 14/905,695

(22) PCT Filed: Jul. 16, 2014

(86) PCT No.: PCT/JP2014/068867
§ 371 (c)(1),
(2) Date: Jan. 15, 2016

(87) PCT Pub. No.: WO2015/008777
PCT Pub. Date: Jan. 22, 2015

(65) Prior Publication Data
US 2016/0152861 A1    Jun. 2, 2016

(30) Foreign Application Priority Data

Jul. 16, 2013  (JP) ................................ 2013-147891
Jul. 16, 2013  (JP) ................................ 2013-147892
Jul. 16, 2013  (JP) ................................ 2013-147893
Feb. 14, 2014  (JP) ................................ 2014-026439

(51) Int. Cl.
| C09D 143/04 | (2006.01) |
| C09D 4/06 | (2006.01) |
| C09D 5/00 | (2006.01) |
| C09D 133/00 | (2006.01) |
| C09D 183/08 | (2006.01) |
| C09D 133/06 | (2006.01) |
| C08L 33/06 | (2006.01) |
| C03C 17/30 | (2006.01) |
| C09D 133/08 | (2006.01) |
| C09D 133/12 | (2006.01) |
| C08F 220/08 | (2006.01) |
| C08F 222/10 | (2006.01) |
| C09D 7/40 | (2018.01) |
| C09D 5/32 | (2006.01) |
| G03F 7/075 | (2006.01) |

(52) U.S. Cl.
CPC ............ C09D 143/04 (2013.01); C03C 17/30 (2013.01); C08F 220/08 (2013.01); C08F 222/10 (2013.01); C08L 33/06 (2013.01); C09D 4/06 (2013.01); C09D 5/00 (2013.01); C09D 5/32 (2013.01); C09D 7/40 (2018.01); C09D 133/00 (2013.01); C09D 133/06 (2013.01); C09D 133/08 (2013.01); C09D 133/12 (2013.01); C09D 183/08 (2013.01); *C03C 2217/29* (2013.01); *G03F 7/0755* (2013.01)

(58) Field of Classification Search
CPC ............................ C09D 143/04; G03G 7/0755
See application file for complete search history.

(56) References Cited

U.S. PATENT DOCUMENTS

| 4,562,714 A | 1/1986 | Tanaka et al. |
| 5,384,342 A | 1/1995 | Szum |
| 2008/0300359 A1 | 12/2008 | Hoshi et al. |
| 2009/0234072 A1* | 9/2009 | Nakagawa .............. C08L 83/06 525/100 |
| 2009/0252932 A1 | 10/2009 | Kitano et al. |
| 2012/0283350 A1 | 11/2012 | Saito et al. |

FOREIGN PATENT DOCUMENTS

| JP | S57-10375 A | 1/1982 |
| JP | H06-190997 A | 7/1994 |
| JP | H07-331014 A | 12/1995 |
| JP | H10-139487 A | 5/1998 |
| JP | H11-61039 A | 3/1999 |
| JP | H11-181347 A | 7/1999 |
| JP | 2003-236995 A | 8/2003 |
| JP | 2006-035209 A | 2/2006 |

(Continued)

OTHER PUBLICATIONS

English translation of International Preliminary Report issued in corresponding application No. PCT/JP2014/068867 dated Jan. 19, 2016 (7 pages).
Official Action dated Jan. 11, 2017, issued by The State Intellectual Property Office of The Peoples Republic of China (SIPO), in related Chinese Patent Application No. CN 201480040364.0 (copy unavailable).

(Continued)

*Primary Examiner* — Margaret G Moore
(74) *Attorney, Agent, or Firm* — Osha Liang LLP

(57) ABSTRACT

An active energy ray-curable resin composition includes 100 parts by weight of (A) a polymer whose main chain is a (meth)acrylic copolymer and which has, at an end of the main chain and/or at a side chain, at least one group having a silicon atom bonded to a hydrolyzable group represented by a formula (I): $-SiR^2_a(OR^1)_{3-a}$ (I), where $R^1$ represents a hydrogen atom or a C1-C10 alkyl group, $R^2$ represents a hydrogen atom or a monovalent hydrocarbon group selected from a C1-C10 alkyl group, a C6-C25 aryl group, and a C7-C12 aralkyl group, and a represents an integer of 0 to 2. The composition further includes 0.1 to 20 parts by weight of (B1) a secondary and/or tertiary amino group-containing silane compound, and 0.05 to 20 parts by weight of (C) a photoacid generator.

22 Claims, No Drawings

(56) References Cited

FOREIGN PATENT DOCUMENTS

| | | | |
|---|---|---|---|
| JP | 2008-308684 | A | 12/2008 |
| JP | 2011-256378 | A | 12/2011 |
| JP | 2012-057007 | * | 2/2012 |
| JP | 2012-057007 | A | 3/2012 |
| JP | 2012-116961 | A | 6/2012 |
| JP | 2012-233134 | A | 11/2012 |
| WO | 2011/058741 | A1 | 5/2011 |

OTHER PUBLICATIONS

International Search Report issued in PCT/JP2014/068867 dated Oct. 21, 2014 (1 page).
Written Opinion of the International Searching Authority issued in PCT/JP2014/068867 dated Oct. 21, 2014 (5 pages).

* cited by examiner

ACTIVE ENERGY-RAY-CURABLE RESIN COMPOSITION FOR COATING ORGANIC OR INORGANIC SUBSTRATE

TECHNICAL FIELD

One or more embodiments of the invention relate to inorganic substrate adhesion-improving compositions for active energy ray-curable resins, active energy ray-curable resin compositions for coating inorganic or organic substrates, laminates, and methods for producing laminates.

BACKGROUND

Inorganic substrates such as metal, glass, or metal-deposited surfaces are coated at room temperature or by baking after various chemical conversions or application of primers. Patent Literature 1 suggests a method in which a composition formed from an acid functional aliphatic polyester polyol and polyisocyanate is directly applied to a cold-rolled steel plate or the like, but this method still involves baking at a temperature as high as at least 100° C. for a long period of time. Moreover, Patent Literature 2 discloses a method in which an alkoxysilyl group-containing acrylic polymer or the like is directly applied to an aluminum plate, but this method involves curing at room temperature or baking.

Meanwhile, glass is used in various building components such as windows and sidings, automobiles and railway vehicles due to its excellent optical transparency, dimensional stability in various temperature ranges and gas barrier properties. In recent years, with its advantage of optical transparency, dimensional stability, and rigidity, glass has been widely used in displays of information and communication devices such as liquid crystal displays and plasma displays.

However, glass has a major drawback in that it is fragile with low resistance to impact or that broken glass scatters. This feature is remarkable particularly in human-carried applications such as information and communication devices.

At the same time, a demand for thinner and lighter displays of information and communication devices has been increasing. Accordingly, cover glass and glass sensors also tend to be thinner, making them more fragile during use. In addition to the impact on the human body due to breakage, breakage of such cover glass or glass sensors, which are expensive materials, namely means that the entire terminal device can no longer be used.

In this context, for example, Patent Literature 3 suggests that breakage and scattering of glass can be greatly prevented by attaching a multilayer laminated film including a polyethylene terephthalate layer and a sebacic acid-copolymerized polyethylene terephthalate layer to a glass surface.

Although the method disclosed in Patent Literature 3 is effective in preventing breakage and scattering of glass, since the sebacic acid-copolymerized polyethylene terephthalate layer included in the multilayer laminated film has a low glass-transition temperature, crystallization gradually proceeds and a blushing phenomenon occurs, resulting in higher haze.

Patent Literature 4 suggests a glass protection film that prevents scattering of glass and such a blushing by use of a film having a multilayer structure in which the haze value and the difference in glass-transition temperature of the film are specified. However, it has problems in that, for example, the difference in glass-transition temperature is large and therefore the film may exhibit dimensional discrepancies depending on the use conditions, and that a special laminating device is required to superimpose the films in a multilayer manner.

A method of applying a coating agent to glass to protect the surface or impart functionality to the surface is also suggested. For example, Patent Literature 5 suggests a method in which a composition essentially containing a thermoplastic polyurethane resin, an epoxy resin or melamine added to an aqueous polyurethane is used as a glass coating material.

However, the object of the method disclosed in Patent Literature 5 is to increase resistance of glass to alkaline washing, and the method involves curing at a temperature as high as at least 100° C. for a period as long as at least 10 minutes to form a coating.

Meanwhile, pre-coated metals are used in which coating is preliminarily applied to a metal plate and then formed into a given shape to be used in a final application. Such a pre-coating method has advantages over the post-coating method in which a metal plate is first formed into a complicated shaped article and then coated, such as rationalized coating step, uniform quality, reduced consumption of coating materials, and so forth. Thus, its application can also be expected to increase in the future.

In this application, a galvanized steel plate or an aluminum plate is subjected to phosphating treatment or chromate treatment to apply a chemical conversion coating and a primer such as an epoxy resin primer or a polyester resin primer is preliminarily applied to the plate before a coating composition for pre-coated metals is applied. In this case, baking at a temperature higher than 200° C. is required.

Since coatings formed from pre-coated metal coating materials are formed into a shape according to the application, the coatings of the coating materials are required to maintain sufficient flexibility enough to withstand forming and sufficient adhesion to the metal surfaces. Then, formed products are required to have properties suitable for the final applications, such as, for example, high weather resistance for use in building exterior materials.

The conventional materials that have been used as pre-coated metal coating materials, such as polyester resin, amino alkyd resin, and thermosetting acrylic resin, have problems in that after processed by forming, their coatings often suffer from cracking or peeling from the steel plate. As a technique to prevent such problems, a wax is used as an internal lubricant. Patent Literature 6 discloses a method of producing a pre-coated metal by applying a composition containing a blocked isocyanate compound blocked with ethyleneimine and a polyol resin to a metal plate and thermally curing the composition. Yet, this method is unable to satisfy all the physical properties descried above.

Patent Literature 7 also suggests a heat-curable, pre-coated metal coating material containing a polyol, an aliphatic or alicyclic blocked polyisocyanate, and an anti-thermal yellowing agent for outside applications and others requiring weather resistance. Yet, it is unable to meet weather resistance sufficiently.

Moreover, Patent Literature 8 suggests curing by active energy rays in order to shorten the process such as curing time and to reduce the energy costs associated with baking at high temperatures. However, it involves the preliminary formation of a chemical conversion coating followed by application to a substrate on which a primer has been applied. No conventional active energy ray-curable materials can be applied directly to metal substrates or chemical conversion coatings.

Furthermore, for excellent design and excellent appearance, composite materials of organic and inorganic substrates are increasingly used in substrates or components to be coated. This has created a desire for an active energy ray-curable coating agent that can successfully adhere to both organic and inorganic substrates; however, no existing coating agents satisfy such properties.

CITATION LIST

Patent Literature

Patent Literature 1: JP-A 2006-35209
Patent Literature 2: JP-A H11-181347
Patent Literature 3: JP-A H06-190997
Patent Literature 4: JP-A 2003-236995
Patent Literature 5: JP-A H10-139487
Patent Literature 6: JP-A S57-10375
Patent Literature 7: JP-A H11-61039
Patent Literature 8: JP-A 2011-256378

SUMMARY OF INVENTION

In view of the situation described above, one or more embodiments of the present invention provide an active energy ray-curable resin composition for coating inorganic-organic substrates, wherein the composition exhibits good adhesion to inorganic substrates such as metal, glass, and metal-deposited surfaces and organic substrates such as acrylic plates, polycarbonate plates, and organic coating films, and has high hardness and high weather resistance enough to withstand outdoor use.

One or more embodiments of the present invention also provide an active energy ray-curable resin composition for coating inorganic-organic substrates further having sufficient flexibility so that it can be used even in pre-coated metal applications in which processability is required.

The present inventors have found that an active energy ray-curable resin composition containing a hydrolyzable silyl group-containing (meth)acrylic copolymer, a specific silane compound, and a photoacid generator can be allowed to form a transparent, cured coating in a short time by electron beam irradiation or UV irradiation using a high pressure mercury lamp or the like, and the resulting coating exhibits good adhesion to inorganic substrates, high surface hardness, excellent weather resistance, and sufficient flexibility for protection of glass and forming.

The present inventors also have found that an active energy ray-curable resin composition containing a hydrolyzable silyl group-containing (meth)acrylic copolymer, a specific silane compound, a photoacid generator, a polyfunctional acrylate, and a photoradical initiator can be allowed to form a transparent, cured coating in a short time by irradiation with active energy rays, and the resulting coating exhibits good adhesion to inorganic and organic substrates, high surface hardness, and excellent weather resistance.

Specifically, one or more embodiments of a first aspect of the present invention relate to an active energy ray-curable resin composition for coating inorganic substrates, the composition containing:

100 parts by weight of (A) a polymer whose main chain is a (meth)acrylic copolymer and which has, at an end of the main chain and/or at a side chain, at least one group having a silicon atom bonded to a hydrolyzable group represented by a formula (I):

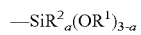 (I)

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and a represents an integer of 0 to 2;

0.1 to 20 parts by weight of (B1) a secondary and/or tertiary amino group-containing silane compound; and 0.05 to 20 parts by weight of (C) a photoacid generator.

Preferably, the silane compound (B1) is a bis(trialkoxysilylalkyl)amine compound.

Preferably, the active energy ray-curable resin composition further contains: 0 to 100 parts by weight of (D) a compound having at least two (meth)acryloyl groups per molecule; and (E) a photoradical initiator in an amount of 0.05 to 50 parts by weight relative to 100 parts by weight of the component (D).

Preferably, the polymer (A) has, per molecule, three or more groups having a silicon atom bonded to a hydrolyzable group.

Preferably, the photoacid generator (C) is an aromatic sulfonium salt or an aromatic iodonium salt.

Preferably, the photoacid generator (C) contains a fluorophosphate anion or a fluorosulfonate anion as a counter anion.

One or more embodiments of the first aspect of the present invention relate to a method for producing a laminate, the method including the steps of: applying the active energy ray-curable resin composition to an inorganic substrate; and curing the active energy ray-curable resin composition by irradiation with active energy rays to form a cured coating.

In the above production method, preferably, the irradiation of active energy rays is carried out in the air.

One or more embodiments of the first aspect of the present invention relate to a method for producing a pre-coated metal, the method including the steps of: applying the active energy ray-curable resin composition to an inorganic substrate; and curing the active energy ray-curable resin composition by irradiation with active energy rays to form a cured coating.

One or more embodiments of the first aspect of the present invention relate to a method for producing a glass material for information and communication devices, the method including the steps of: applying the active energy ray-curable resin composition to a glass substrate; and curing the active energy ray-curable resin composition by irradiation with active energy rays to form a protective coating.

One or more embodiments of the first aspect of the present invention relate to a laminate, obtained by the method for producing a laminate and including a cured coating directly formed on a surface of an inorganic substrate.

In the laminate, preferably, the inorganic substrate is a transparent conductive film for use in touch panels of information and communication devices.

One or more embodiments of a second aspect of the present invention relate to an inorganic substrate adhesion-improving composition for active energy ray-curable resins, the composition containing:

(A) a polymer whose main chain is a (meth)acrylic copolymer and which has, at an end of the main chain and/or at a side chain, at least one group having a silicon atom bonded to a hydrolyzable group represented by a formula (I):

 (I)

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and a represents an integer of 0 to 2;

(B2) a silane compound represented by a formula (II):

$$R^5N-\{X-SiR^4{}_b(OR^3)_{3-b}\}_2 \qquad (II)$$

wherein X represents a divalent organic group and may contain an oxygen atom or a nitrogen atom in its structure; $R^3$, $R^4$, and $R^5$ may be the same or different, and each represents a hydrogen atom or a C1-C10 alkyl group; and b represents an integer of 0 to 2; and (C) a photoacid generator.

Preferably, the silane compound (B2) is a bis(trialkoxysilylalkyl)amine compound.

One or more embodiments of the second aspect of the present invention relate to an inorganic substrate-adhesive active energy ray-curable resin composition containing the inorganic substrate adhesion-improving composition and a binder component.

Preferably, the binder component contains (D) a compound having at least two (meth)acryloyl groups per molecule, and (E) a photoradical initiator.

Preferably, the composition contains, relative to 100 parts by weight of the component (D), 0.05 to 50 parts by weight of the component (E) and 10 to 100 parts by weight of the component (A), and the composition contains, relative to 100 parts by weight of the component (A), 0.1 to 100 parts by weight of the component (B2) and 0.05 to 20 parts by weight of the component (C).

Preferably, the component (A) has, per molecule, three or more groups having a silicon atom bonded to a hydrolyzable group.

Preferably, the component (C) is an aromatic sulfonium salt or an aromatic iodonium salt.

Preferably, the component (C) contains a fluorophosphate anion or a fluorosulfonate anion as a counter anion.

One or more embodiments of the second aspect of the present invention relate to a method for producing a laminate, the method including the steps of: applying the active-energy-ray-curable resin composition to an inorganic substrate; and curing the active energy ray-curable resin composition by irradiation with active energy rays to form a cured coating.

One or more embodiments of the second aspect of the present invention relate to a laminate, obtained by the method for producing a laminate and including a cured coating directly formed on a surface of an inorganic substrate.

One or more embodiments of a third aspect of the present invention relate to an active energy ray-curable resin composition for coating organic and/or inorganic substrates, the composition containing:

(A) a polymer whose main chain is a (meth)acrylic copolymer and which has, at an end of the main chain and/or at a side chain, at least one group having a silicon atom bonded to a hydrolyzable group represented by a formula (I):

$$-SiR^2{}_a(OR^1)_{3-a} \qquad (I)$$

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and a represents an integer of 0 to 2; (B2) a silane compound represented by a formula (II):

$$R^5N-\{X-SiR^4{}_b(OR^3)_{3-b}\}_2 \qquad (II)$$

wherein X represents a divalent organic group and may contain an oxygen atom or a nitrogen atom in its structure; $R^3$, $R^4$, and $R^5$ may be the same or different, and each represents a hydrogen atom or a C1-C10 alkyl group; and b represents an integer of 0 to 2;

(C) a photoacid generator;

(D) a compound having at least two (meth)acryloyl groups per molecule; and (E) a photoradical initiator.

Preferably, the silane compound (B2) is a bis(trialkoxysilylalkyl)amine compound.

Preferably, the composition contains, relative to 100 parts by weight of the component (A), 0.1 to 50 parts by weight of the component (B2), 0.05 to 20 parts by weight of the component (C), and 1 to 100 parts by weight of the component (D), and the composition contains 0.05 to 50 parts by weight of the component (E) relative to 100 parts by weight of the component (D).

Preferably, the component (A) has, per molecule, three or more groups having a silicon atom bonded to a hydrolyzable group.

Preferably, the component (C) is an aromatic sulfonium salt or an aromatic iodonium salt.

Preferably, the component (C) contains a fluorophosphate anion or a fluorosulfonate anion as a counter anion.

One or more embodiments of the third aspect of the present invention relate to a method for producing a laminate, the method including the steps of: applying the active energy ray-curable resin composition to an organic substrate and/or an inorganic substrate and/or an organic-inorganic composite substrate; and curing the active energy ray-curable resin composition by irradiation with active energy rays to form a cured coating.

One or more embodiments of the third aspect of the present invention relate to a laminate, obtained by the method for producing a laminate and including a cured coating directly formed on a surface of an organic inorganic substrate and/or an inorganic substrate and/or an organic-inorganic composite substrate.

With the active energy ray-curable resin compositions of one or more embodiments of the present invention, coatings can be formed in a short time by electron beam irradiation or UV irradiation using a high pressure mercury lamp, metal halide lamp, light emitting diode, or the like after coating, wherein the coatings exhibit good adhesion to inorganic substrates such as metal, glass, and metal-deposited surfaces, or organic substrates such as acrylic resin, ABS resin, polycarbonate resin, vinyl chloride resin, polyester resin (e.g. PET), and organic coating films, high hardness, high weather resistance enough to withstand outdoor use, and sufficient flexibility.

DESCRIPTION OF EMBODIMENTS

First, embodiments of the first aspect of the present invention are described.

The active energy ray-curable resin composition for coating inorganic substrates according to one or more embodiments of the first aspect of the present invention contains:

100 parts by weight of (A) a polymer whose main chain is a (meth)acrylic copolymer and which has, at an end of the main chain and/or at a side chain, at least one group having a silicon atom bonded to a hydrolyzable group represented by a formula (I):

$$-SiR^2{}_a(OR^1)_{3-a} \qquad (I)$$

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and the symbol "a" represents an integer of 0 to 2;

0.1 to 20 parts by weight of (B1) a secondary and/or tertiary amino group-containing silane compound; and 0.05 to 20 parts by weight of (C) a photoacid generator.

<(A) Polymer Having at Least One Group Having a Silicon Atom Bonded to a Hydrolyzable Group>

The polymer (A) is any one that contains a hydrolyzable silyl group (a group having a silicon atom bonded to a hydrolyzable group) bonded to a carbon atom.

The group having a silicon atom bonded to a hydrolyzable group may be bonded to an end of the main chain of the polymer (A) or a side chain thereof, or to both an end of the main chain and a side chain thereof.

The number of groups having a silicon atom bonded to a hydrolyzable group per molecule of the polymer (A) is preferably 3 or more, more preferably 5 or more. At the same time, the number is preferably 80 or less, more preferably 50 or less. If the number of groups having a silicon atom is less than 3, initial curability or adhesion on inorganic substrates (inorganic substrate adhesion) may be insufficient and improved weather resistance or solvent resistance may not be obtained. Conversely, if the number of groups having a silicon atom is more than 80, flexibility or storage stability tends to be reduced and cracks tend to occur.

The group having a silicon atom bonded to a hydrolyzable group may be introduced into the polymer by, for example, a method in which a monomer containing a group having a silicon atom bonded to a hydrolyzable group is copolymerized with another monomer; a method in which a silicate compound is reacted; or a method in which a silicate compound is reacted with a hydroxyl group-containing copolymer. Among these, a simple method is the one in which a monomer containing a group having a silicon atom bonded to a hydrolyzable group is copolymerized with another monomer.

In the group having a silicon atom bonded to a hydrolyzable group, examples of the hydrolyzable group include halogen groups, alkoxy groups and the like. Among these, alkoxy groups are useful due to their easiness of reaction control.

The group having a silicon atom bonded to a hydrolyzable group is represented by the following formula (I):

$$-SiR^2_a(OR^1)_{3-a} \quad (I)$$

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and the symbol "a" represents an integer of 0 to 2.

Preferably, $R^1$ is a C1-C4 alkyl group because the resulting composition has excellent curability.

Also for excellent curability, preferably, $R^2$ is a hydrogen atom, a C1-C6 alkyl group, or an aryl group.

In the formula (I), the symbol "a" represents an integer of 0 to 2. Thus, the "3−a" in $(OR^1)_{3-a}$ is at least 1 but not more than 3. The symbol "a" is preferably 0 or 1 because the resulting composition has good curability. Thus, the number of $R^2$s bonded to the silicon group is preferably 0 or 1. In the case where the number of $OR^1$s or $R^2$s is two or more, each $OR^1$ or $R^2$ may be the same or different. Specific examples of the hydrolyzable silyl group represented by the formula (I) include groups contained in hydrolyzable silyl group-containing vinyl monomers as described later.

The component (A) may be used alone or in combinations of two or more.

Next, an example of a method for producing the polymer (A) is described.

The polymer (A) can be produced, for example, by copolymerizing a hydrolyzable silyl group-containing vinyl monomer (A-a) and another copolymerizable monomer (A-b) by solution polymerization or the like using a radical polymerization initiator such as azobisisobutyronitrile.

Specific examples of the hydrolyzable silyl group-containing vinyl monomer (A-a) include vinyltrimethoxysilane, vinylmethyldimethoxysilane, vinyltriethoxysilane, vinylmethyldiethoxysilane, vinyltris(2-methoxyethoxy)silane, vinyltriisopropoxysilane, γ-(meth)acryloxypropyltrimethoxysilane, γ-(meth)acryloxypropylmethyldimethoxysilane, γ-(meth)acryloxypropyltriethoxysilane, γ-(meth)acryloxypropylmethyldiethoxysilane, γ-(meth)acryloxypropyltri-n-propoxysilane, γ-(meth)acryloxypropyltriisopropoxysilane, vinyltriacetoxysilane, and β-(meth)acryloxyethyltrimethoxysilane. The hydrolyzable silyl group-containing vinyl monomer (A-a) may be used alone or in combinations of two or more thereof.

Preferred among these are γ-(meth)acryloxypropyltrimethoxysilane, γ-(meth)acryloxypropylmethyldimethoxysilane, γ-(meth)acryloxypropyltriethoxysilane, and γ-(meth)acryloxypropylmethyldiethoxysilane, in view of easy handling, cost, and polymerization stability and because the resulting composition has excellent curability.

The hydrolyzable silyl group-containing vinyl monomer (A-a) is desirably copolymerized in such a manner that the polymer (A) has 3 to 80, more preferably 5 to 50 silyl groups per molecule. If the number of silyl groups per molecule of the polymer (A) is less than 3, initial curability or adhesion on inorganic substrates (inorganic substrate adhesion) may be insufficient and improved weather resistance or solvent resistance may not be obtained. Conversely, if the number of silyl groups per molecule of the polymer (A) is more than 80, flexibility or storage stability tends to be reduced and cracks tend to occur.

Specific examples of the other copolymerizable monomer (A-b) include methyl(meth)acrylate, ethyl(meth)acrylate, n-butyl(meth)acrylate, i-butyl(meth)acrylate, t-butyl(meth)acrylate, cyclohexyl(meth)acrylate, 2-ethylhexyl(meth)acrylate, stearyl(meth)acrylate, lauryl(meth)acrylate, benzyl(meth)acrylate, 3,3,5-trimethylcyclohexyl(meth)acrylate, glycidyl(meth)acrylate, isobornyl(meth)acrylate, (meth)acrylamide, α-ethyl(meth)acrylamide, N-butoxymethyl(meth)acrylamide, N,N-dimethyl(meth)acrylamide, N-methyl(meth)acrylamide, N-methylol(meth)acrylamide and other acrylamides, (meth)acryloylmorpholine, 2-hydroxyethyl(meth)acrylate, 2-hydroxypropyl(meth)acrylate, 2-hydroxybutyl(meth)acrylate, 4-hydroxybutyl(meth)acrylate, glycerol mono(meth)acrylate, 2-hydroxyethyl vinyl ether, 4-hydroxystyrene, vinyltoluene, Aronix 5700 (Toagosei Co., Ltd.), HE-10, HE-20, HP-1 and HP-2 (hydroxyl-terminated acrylic acid ester oligomers available from Nippon Shokubai Co., Ltd.), polyalkylene glycol(meth)acrylate derivatives such as Blemmer PP series, Blemmer PE series, and Blemmer PEP series available from NOF Corporation, s-caprolactone-modified hydroxyalkyl vinyl copolymer compounds obtained by reaction of hydroxyl group-containing compounds and s-caprolactone, Placcel FM-1 and FM-4 (both available from Daicel Corporation) and Tone M 201 (Union Carbide Corporation), polycarbonate-containing vinyl compounds such as HEAC-1 (Daicel Corporation), and other hydroxyl group-containing vinyl monomers and/or derivatives thereof.

Other examples include (meth)acrylic acid ester compounds such as (meth)acrylates containing a urethane bond or a siloxane bond; aromatic hydrocarbon vinyl compounds such as styrene, α-methylstyrene, chlorostyrene, styrenesulfonic acid, 4-hydroxystyrene, and vinyltoluene; acid anhydrides of unsaturated carboxylic acids such as maleic anhydride, and esters of unsaturated carboxylic acids such as diesters and half esters of the aforementioned acid anhydrides with C1-C20 straight- or branched-chain alcohols or amines; vinyl esters and allyl compounds such as vinyl acetate, vinyl propionate, and diallyl phthalate; and other vinyl compounds such as (meth)acrylonitrile, 2-hydroxyethyl vinyl ether, methyl vinyl ether, cyclohexyl vinyl ether, vinyl chloride, vinylidene chloride, chloroprene, propylene, butadiene, isoprene, fluoroolefinmaleimide, N-vinylimidazole, and vinylsulfonic acid.

The other monomer (A-b) may be used alone or in combinations of two or more thereof.

The polymer (A) thus obtained preferably has a number average molecular weight of 3000 to 50000, more preferably 5000 to 30000, because the resulting composition is used to form a coating having excellent physical properties such as curability, solvent resistance, and chemical resistance. If necessary, a chain transfer agent such as n-dodecyl mercaptan, γ-mercaptopropyltrimethoxysilane, or γ-mercaptopropyltriethoxysilane may be used to adjust the molecular weight.

The phrase "the main chain of the polymer (A) is a (meth)acrylic copolymer" means that 50% or more, preferably 70% or more of the units constituting the main chain of the polymer (A) are (meth)acrylic)acrylic monomer units. The term "(meth)acrylic" is a general term referring to both acrylic and methacrylic.

<(B) Silane Compound>

In one or more embodiments of the first aspect of the present invention, a secondary and/or tertiary amino group-containing silane compound (B1) is used as a silane compound (B). The component (B1) refers to a compound generally called aminosilane and is used to improve adhesion to inorganic substrates. Specific examples of the secondary and/or tertiary amino group-containing silane compound include mono(alkoxysilyl)amine compounds such as N-phenylaminopropyltrimethoxysilane and N-phenylaminopropyltriethoxysilane; bis(alkoxysilylalkyl)amine compounds such as bis(trimethoxysilylpropyl)amine, bis(triethoxysilylpropyl)amine, bis(methyldimethoxysilylpropyl)amine, bis(ethyldimethoxysilylpropyl)amine, bis(dimethylmethoxysilylpropyl)amine, bis(trimethoxysilylethyl)amine, bis(triethoxysilylethyl)amine, bis(trimethoxysilylmethyl)amine, and bis(triethoxysilylmethyl)amine; and aminosilane compounds obtainable from products of addition reaction between an epoxy group and an amino group, such as a reaction product of γ-glycidoxypropyltrimethoxysilane and N-(2-aminoethyl)-3-aminopropyltrimethoxysilane at a molar ratio of 2:1, and a reaction product of Epicoat 828 (Yuka Shell Epoxy Co., Ltd.), an epoxy resin prepared from bisphenol A resin and epichlorohydrin, and γ-aminopropyltriethoxysilane at a molar ratio of 1:2.

Among these, bis(alkoxysilylalkyl)amine compounds and aminosilane compounds obtainable from products of addition reaction between an epoxy group and an amino group are preferred, and bis(trialkoxysilylalkyl)amine compounds are more preferred, because these compounds are less likely to inhibit the curability and therefore result in better storage stability and better adhesion to inorganic substrates.

The component (B1) may be used alone or in combinations of two or more thereof.

The amount of the component (B1) relative to 100 parts by weight of the solids content of the polymer (A) is 0.1 to 20 parts by weight, preferably 0.5 parts by weight or more, more preferably 1 part by weight or more. At the same time, the amount is preferably 10 parts by weight or less, more preferably 5 parts by weight or less. If the amount of the component (B1) is less than 0.1 parts by weight, adhesion tends to be reduced in a test of long-term immersion in boiling water, or the like. If the amount of the component (B1) is more than 20 parts by weight, curing rate tends to be reduced, causing tack.

Since primary amino group-containing silane compounds affect storage stability of curable compositions, the amount of such a silane compound is preferably less than 3 parts by weight, more preferably less than 1 part by weight, still more preferably less than 0.1 parts by weight, particularly preferably substantially 0 parts by weight, relative to 100 parts by weight of the component (A).

<(C) Photoacid Generator>

A photoacid generator, the component (C), refers to a compound that generates an acid upon exposure to active energy rays. Examples include strong acids such as toluenesulfonic acid and boron tetrafluoride; onium salts such as sulfonium salts, ammonium salts, phosphonium salts, iodonium salts, and selenium salts; iron-arene complexes; silanol-metal chelate complexes; sulfonic acid derivatives such as disulfones, disulfonyldiazomethanes, disulfonylmethanes, sulfonylbenzoylmethanes, imidosulfonates, and benzoinsulfonates; and compounds that generate an acid upon exposure to radiation as disclosed in JP-A H05-134412, such as organohalogen compounds.

Examples of sulfonic acid derivatives include sulfonic acid esters such as benzoin tosylate, nitrobenzyl tosylate, and succinimide tosylsulfonate as disclosed in U.S. Pat. No. 4,618,564; oxime sulfonates such as α-(4-tosyloxyimino)-4-methoxybenzyl cyanide as disclosed in U.S. Pat. No. 4,540,598 and JP-A H06-67433; tris(methanesulfonyloxy)benzene and the like disclosed in JP-A H06-348015; 9,10-dialkoxyanthracenesulfonic acid nitrobenzyl esters and the like disclosed in JP-A S64-18143; and N-(p-dodecylbenzenesulfonyloxy)-1,8-naphthalimide. Examples of organohalogen compounds include halogen-containing triazine compounds such as 2-(4-methoxyphenyl)-4,6-bis(trichloromethyl)-1,3,5-triazine, 2-(3,4-dimethoxystyryl)-4,6-bis(trichloromethyl)-1,3,5-triazine, and 2-[2-(5-methylfuran-2-yl)vinyl]-4,6-bis(trichloromethyl)-1,3,5-triazine as disclosed in JP-A S55-32070, JP-A S48-36281, and JP-A S63-238339; halogen-containing sulfone compounds such as 2-pyridyl-tribromomethylsulfone as disclosed in JP-A H02-304059; halogenated alkylphosphate esters such as tris(2-chloropropyl)phosphate, tris(2,3-dichloropropyl)phosphate, and tris(2,3-dibromopropyl)phosphate; halogen-containing heterocyclic compounds such as 2-chloro-6-(trichloromethyl)pyridine; and halogen-containing hydrocarbon compounds such as 1,1-bis[p-chlorophenyl]-2,2,2-trichloroethane, vinylidene chloride copolymers, vinyl chloride copolymers, and chlorinated polyolefins.

Among these photoacid generators, aromatic sulfonium salts or aromatic iodonium salts are preferred because of its easy availability and high stability in compositions containing the polymer (A).

The counter anion is preferably a fluorophosphate anion, a fluoroantimonate anion, a fluoroborate anion, or a fluorosulfonate anion for quick curing and excellent adhesion to substrates. In view of safety, it is particularly preferably a fluorophosphate anion, a fluoroborate anion, or a fluorosulfonate anion.

The photoacid generator is particularly preferably an aromatic sulfonium salt or an aromatic iodonium salt in which the counter anion is a fluorophosphate anion, a fluoroborate anion, or a fluorosulfonate anion.

The component (C) may be used alone or may be used in combinations of two or more in view of curing rate and the like. The amount of the component (C) must be adjusted according to the yield and generation rate of the acid, but it is 0.05 to 20 parts by weight, preferably 0.1 parts by weight or more, more preferably 0.5 parts by weight or more, relative to 100 parts by weight of the solids content of the polymer (A). At the same time, it is preferably 10 parts by weight or less, more preferably 5 parts by weight or less. If the amount of the component (C) is less than 0.05 parts by weight, the yield of the acid will be insufficient and the resulting coating tends to have insufficient solvent resistance and insufficient chemical resistance. If the amount of the component (C) is more than 20 parts by weight, the resulting coating tends to have a poor appearance and coloration.

The active energy ray-curable resin composition for coating inorganic substrates according to one or more embodiments of the first aspect of the present invention may further contain the following components.

<(D) Compound Having at Least Two (Meth)Acryloyl Groups Per Molecule>

A compound having at least two (meth)acryloyl groups, the component (D), can be used to increase crosslink density immediately after irradiation with active energy rays and suppress tack.

Any compound having (meth)acryloyl groups commonly used for radical curing can be used as the component (D); however, compounds containing a primary or secondary amino group in their structure are not preferred because they cancel out the activity of the component (C).

Specific examples of the component (D) include di(meth)acrylates such as ethylene glycol di(meth)acrylate, polyethylene glycol di(meth)acrylate, 1,6-hexanediol di(meth)acrylate, neopentyl glycol di(meth)acrylate, and tripropylene glycol di(meth)acrylate; tri(meth)acrylates such as trimethylolpropane tri(meth)acrylate, trimethylolmethane tri(meth)acrylate, pentaerythritol tri(meth)acrylate, and triisocyanurate tri(meth)acrylate; tetra(meth)acrylates such as pentaerythritol tetra(meth)acrylate and tetramethylolmethane tetra(meth)acrylate; and tetra- or higher-functional (meth)acrylates such as dipentaerythritol hexa(meth)acrylate.

Other examples include polyfunctional urethane acrylates such as NK Oligo UA-122P, NK Oligo U-4HA, and NK Oligo U-6LPA (all from Shin Nakamura Chemical Co., Ltd.), AT-600, UA-306H, and UA-510H (all from Kyoeisha Chemical Co., Ltd.), and EBECRYL 220, EBECRYL 8210, and EBECRYL 8311 (all from Daicel-Cytec Company Ltd.); and polyfunctional epoxyacrylates such as NK Oligo EA-1020, NK Oligo EA-6310, and NK Oligo EA-7120 (all from Shin Nakamura Chemical Co., Ltd.), Epoxy Ester 70PA and Epoxy Ester 3002A (both from Kyoeisha Chemical Co., Ltd.), and EBECRYL 600 and EBECRYL 6040 (both from Daicel-Cytec Company Ltd.).

The component (D) may be used alone or in combinations of two or more thereof.

The amount of the component (D) is preferably 0 to 100 parts by weight, more preferably 0 to 70 parts by weight, still more preferably 0 to 50 parts by weight, relative to 100 parts by weight of the component (A). If the amount of the component (D) is more than 100 parts by weight, weather resistance may be reduced.

<(E) Photoradical Initiator>

When the photoacid generator, the component (C), is decomposed by active energy rays to generate an acid, aryl radicals and the like are generated. Thus, in the case where the composition contains the component (D), the polymerization reaction proceeds without the addition of a photoradical initiator, the component (E). However, it is preferred that the composition contain the component (E) for efficient reaction of the component (D). The photoradical initiator, the component (E), refers to a compound that generates radicals upon exposure to active energy rays and acts as a polymerization initiator when the composition contains the component (D). Specific examples of the component (E) include carbonyl compounds such as benzoin, benzoin monomethyl ether, benzoin isopropyl ether, acetoin, benzil, benzophenone, p-methoxybenzophenone, diethoxyacetophenone, benzyl dimethyl ketal, 2,2-diethoxyacetophenone, 1-hydroxycyclohexyl phenyl ketone, methyl phenylglyoxylate, ethyl phenylglyoxylate, and 2-hydroxy-2-methyl-1-phenylpropan-1-one; sulfur compounds such as tetramethylthiuram monosulfide and tetramethylthiuram disulfide; and acylphosphine oxides such as 2,4,6-trimethylbenzoyl-diphenylphosphine oxide. There are commercial products such as IRGACURE series including IRGACURE 184 and IRGACURE 819 and DAROCUR series including DAROCUR 1173 and DAROCUR TPO (all from BASF), KAYACURE series including KAYACURE DETX-S and KAYACURE CTX (all from Nippon Kayaku Co., Ltd.), and TAZ series including TAZ-101 and TAZ-110 (all from Midori Kagaku Co., Ltd.).

The component (E) may be used alone or may be used in combinations of two or more in view of curing rate and the like.

The component (E) is necessary when the component (D) is added. The amount must be adjusted according to the yield of radicals and the intended molecular weight, but it is preferably 0.05 parts by weight or more, more preferably 0.1 parts by weight or more, relative to 100 parts by weight of the component (D). At the same time, the amount is preferably 50 parts by weight or less, more preferably 30 parts by weight or less. If the amount of the component (E) is less than 0.05 parts by weight, the yield of radicals will be insufficient and the component (D) may be insufficiently cured, causing tack; while an amount of more than 50 parts by weight tends to cause poor coloration and reduced weather resistance.

<(F) Silicon Compound>

In order to improve adhesion to glass substrates, coating hardness, and stain removability when the coating surface is made hydrophilic for outdoor use, and the like, it is possible to use a silicon compound and/or its partial hydrolysis-condensation product (F) represented by a formula (III):

$(R^6O)_4$—Si  (III)

wherein $R^6$ represents a monovalent hydrocarbon group selected from a C1-C10 alkyl group, a C6-C10 aryl group, and a C7-C10 aralkyl group.

$R^6$ in the alkyl silicate is preferably a C1-C3 alkyl group in view of curability because the presence of many carbon atoms or a branch results in reduced hydrolysis-condensation reactivity.

Specific examples of the component (F) include tetraalkyl silicates such as tetramethoxysilane, tetraethoxysilane, tetra-n-propoxysilane, tetra-i-propoxysilane, tetra-n-butoxysilane, tetra-i-butoxysilane, and tetra-t-butoxysilane, and partial hydrolysis-condensation products thereof. Among these, Methyl Silicate 51 (Colcoat Co., Ltd.), MKC Silicate 51, MKC Silicate 56, MKC Silicate 56S, and MKC Silicate 57

(all from Mitsubishi Chemical Corporation), and others in which the carbon number of $R^6$ is 1 are desirable because the resulting coating exhibits excellent glass adhesion.

The component (F) may be used alone or in combinations of two or more thereof.

When it is a partial hydrolysis-condensation product, the resulting coating surface can have improved hydrophilicity. The partial hydrolysis-condensation product preferably has a degree of condensation of about 2 to 20, more preferably in the range of 3 to 15.

The amount of the component (F) is preferably 0 to 50 parts by weight, more preferably 0 to 20 parts by weight, relative to 100 parts by weight of the component (A). If the amount of the component (F) is more than 50 parts by weight, initial tack tends to remain.

In the active energy ray-curable resin composition of one or more embodiments of the first aspect of the present invention, a photosensitizer can be used, if necessary, in order to improve photosensitivity of the component (C) or the component (E). Any photosensitizer may be used. Examples include anthracene derivatives, benzophenone derivatives, thioxanthone derivatives, anthraquinone derivatives, and benzoin derivatives. More specific examples include 9,10-dialkoxyanthracenes, 2-alkylthioxanthones, 2,4-dialkylthioxanthones, 2-alkylanthraquinones, 2,4-dialkylanthraquinones, p,p'-aminobenzophenones, 2-hydroxy-4-alkoxybenzophenones, and benzoin ethers. Still more specific examples include anthrone, anthracene, 9,10-diphenylanthracene, 9-ethoxyanthracene, pyrene, perylene, coronene, phenanthrene, benzophenone, benzil, benzoin, methyl 2-benzoylbenzoate, butyl 2-benzoylbenzoate, benzoin ethyl ether, benzoin-i-butyl ether, 9-fluorenone, acetophenone, p,p'-tetramethyldiaminobenzophenone, p,p'-tetraethylaminobenzophenone, 2-chlorothioxanthone, 2-isopropylthioxanthone, 2,4-diethylthioxanthone, phenothiazine, acridine orange, benzoflavin, setoflavin-T, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), 9,10-dibutoxyanthracene, and 9,10-dipropoxyanthracene. The photosensitizer may be used alone or in combinations of two or more thereof.

The amount of the photosensitizer may be adjusted as appropriate according to the wavelength of light for curing or the intended curing rate. If used, the amount is preferably 200 parts by weight or less, more preferably 100 parts by weight or less, still more preferably 50 parts by weight or less, relative to 100 parts by weight in total of the components (C) and (E), in view of coloration and cost.

Photosensitizers that can absorb light in a wavelength range which cannot be absorbed by the component (C) or the component (E) are more efficient. Thus, photosensitizers whose absorption wavelength range has less overlap with that of the component (C) or the component (E) are preferred.

The active energy ray-curable resin composition of one or more embodiments of the first aspect of the present invention, which contains a hydrolyzable silyl group, reacts with moisture. Hence, it is preferred to further add a dehydrating agent to improve storage stability of the composition.

Examples of the dehydrating agent include orthocarboxylic acid esters, including, for example, alkyl orthoformates such as methyl orthoformate, ethyl orthoformate, and butyl orthoformate; alkyl orthoacetates such as methyl orthoacetate, ethyl orthoacetate, and butyl orthoacetate; and alkyl orthoborates such as methyl orthoborate, ethyl orthoborate, and butyl orthoborate, as well as highly active silane compounds such as tetramethoxysilane, tetraethoxysilane, and methyltrimethoxysilane.

The amount of the dehydrating agent is preferably 0.1 to 10 parts by weight relative to 100 parts by weight of the solids content of the polymer (A).

The active energy ray-curable resin composition of one or more embodiments of the first aspect of the present invention may contain metal oxide fine particles to improve coating hardness and scratch resistance. Examples of the metal oxide fine particles include silica ($SiO_2$), alumina ($Al_2O_3$), tin oxide ($SnO_2$), zirconia ($ZrO_2$), zinc oxide (ZnO), titania ($TiO_2$), ITO (indium tin oxide), antimony oxide ($Sb_2O_3$, $Sb_2O_5$), and composite fine particles thereof. Among these, silica fine particles are preferred and the amount thereof is preferably 0 to 50 parts by weight, more preferably 0 to 30 parts by weight, relative to 100 parts by weight of the component (A). If the amount is more than 50 parts by weight, the metal fine particles may be settled down and the resulting coating may exhibit white turbidity.

In the case where the component (D) and the component (E) are added to the active energy ray-curable resin composition of one or more embodiments of the first aspect of the present invention, preferably, a polymerization inhibitor is added to improve storage stability. Examples of the polymerization inhibitor include phenols such as hydroquinone, p-methoxyphenol, and 2,6-di-t-butylphenol, amines such as phenothiazine and methylene blue, copper salts such as copper dibutyldithiocarbamate, as well as nitro compounds, nitroso compounds, and N-oxyl compounds. The amount thereof is preferably 0 to 0.5 parts by weight, more preferably 0 to 0.3 parts by weight, relative to 100 parts by weight of the component (D). An amount of more than 0.5 parts by weight may cause a decrease in the reactivity of the component (D).

Also in the case where the component (D) is a urethane acrylate, a mercapto group-containing compound may be added to improve storage stability. This is for preventing the hydrolysis-condensation reaction of the polymer (A) from being induced by residues of the organotin compound used in the synthesis of the urethane acrylate. Examples of the mercapto group-containing compound include n-dodecyl mercaptan, t-dodecyl mercaptan, and γ-mercaptopropyltrimethoxysilane. The amount thereof is preferably 0 to 20 parts by weight, more preferably 0 to 10 parts by weight, relative to 100 parts by weight of the component (D). If the amount of the mercapto group-containing compound is more than 20 parts by weight, it may cause odor and tack may be left in the resulting cured coating.

The active energy ray-curable resin composition of the first aspect of one or more embodiments of the present invention may contain a monofunctional (meth)acrylate compound to control crosslink density and to improve post-processability of the resulting coating. The amount of the monofunctional (meth)acrylate compound is preferably 0 to 30 parts by weight, more preferably 0 to 20 parts by weight, relative to 100 parts by weight of the component (A). If the amount of the monofunctional (meth)acrylate compound is more than 30 parts by weight, hardness or chemical resistance tends to be reduced.

The active energy ray-curable resin composition of the first aspect of one or more embodiments of the present invention may contain a solvent. Any solvent can be used and may be selected in view of damage to the substrate or volatilization rate. Specific examples include ketones such as methyl isobutyl ketone and diisobutyl ketone; alcohols such as butanol and isopropyl alcohol; esters such as butyl acetate and isopropyl acetate; ethers such as diethylene glycol methyl ether and propylene glycol methyl ether; aromatic solvents; and aliphatic solvents. The amount of the solvent is preferably 0 to 300 parts by weight, more preferably 0 to 200 parts by weight, relative to 100 parts by weight of the component (A). If the amount of the solvent is more than 300 parts by weight, drying of the solvent may take a long time.

If necessary, additives commonly used in coating materials, such as inorganic and organic pigments, plasticizers, dispersants, wetting agents, thickeners, and defoamers may be added to the active energy ray-curable resin composition of the first aspect of one or more embodiments of the present invention.

The water content in the active energy ray-curable resin composition of one or more embodiments of the present invention is preferably low. The water content in the composition is preferably 3% by weight or less, more preferably 1% by weight or less, still more preferably 0.5% by weight or less. It is particularly preferred that the composition contain no water. If the water content is more than 3% by weight, storage stability or adhesion to inorganic substrates tends to be reduced.

The active energy ray-curable resin composition of one or more embodiments of the present invention may be prepared by any method, and may also be a one-pack or two-pack type.

Since the active energy ray-curable resin composition of one or more embodiments of the present invention has high storage stability when shielded from light, it can be in the form of a one-pack coating material.

When the active energy ray-curable resin composition of the first aspect of one or more embodiments of the present invention is cured, the thickness of the coating film is preferably 1 to 100 µm after curing. A thickness of less than 1 µm tends to fail to provide sufficient hardness or weather resistance, while a thickness of more than 100 µm tends to result in retardation of curing of the polymer (A) at the depth. If the thickness needs to be more than 100 µm, it is preferred to repeat the cycle of coating and irradiation with active energy rays several times.

Examples of the active energy rays include visible light, ultraviolet rays, infrared ray, X-rays, α-rays, β-rays, γ-rays, and electron beams. Ultraviolet rays or electron beams are most preferred because they allow for a fast reaction rate and a relatively inexpensive active energy ray generator.

Moreover, an inert gas atmosphere is required for irradiation with active energy rays, and especially with electron beams. However, with the active energy ray-curable resin composition of the first aspect of one or more embodiments of the present invention, a good cured coating can be obtained even when irradiation is carried out in the air.

The active energy ray-curable resin composition of the first aspect of one or more embodiments of the present invention can be suitably used for coating, for example, metals, ceramics, glass, cement, and ceramic-based substrates, and also for coating buildings, household electric appliances, industrial equipment and the like which are formed from plastics, films, sheets, wood, paper, fibers or the like.

Since the active energy ray-curable resin composition of the first aspect of one or more embodiments of the present invention is excellent in adhesion to inorganic substrates, it can be used not only as a primer on these substrates but also as an overcoat or a single finish coat on these substrates because it provides an excellent appearance in terms of finishing quality, gloss and the like, and also exhibits high weather resistance.

Since the active energy ray-curable resin composition of the first aspect of one or more embodiments of the present invention is excellent in adhesion to inorganic substrates, transparency, and scratch resistance, it can also be used as a protective coating on the outermost layer of touch panels for screens of information and communication devices such as mobile phones, smartphones, portable game consoles, car navigation systems, ticket vending machines, or bank automated teller machines. The composition is also excellent in adhesion to glass having a transparent conductive film such as an ITO film and thus can be used as a protective coating for such glass. Usually, films are used as protective materials for transparent conductive film glass. However, these films have a thickness of 50 µm or more and it is difficult to make them thinner. In addition, when such a film is bonded with an optical adhesive or the like, issues such as deflection or positional misalignment may occur. In contrast, the coating formed from the curable composition of the first aspect of one or more embodiments of the present invention can be applied to a thickness of several micrometers to several tens of micrometers, which makes it possible to provide a thinner protective material. It is also possible to eliminate process issues such as deflection and positional misalignment.

A method for producing a laminate according to the first aspect of one or more embodiments of the present invention includes the steps of: applying the active energy ray-curable resin composition of the first aspect of one or more embodiments of the present invention to an inorganic substrate; and curing the active energy ray-curable resin composition by irradiation with active energy rays to form a cured coating.

Examples of the inorganic substrate include glass, aluminum, steel plates, tin plates, and stainless steel.

The irradiation of active energy rays may be carried out in the air.

The first aspect of one or more embodiments of the present invention also encompasses a laminate obtained by the above production method.

When the inorganic substrate used is a cold-rolled steel plate, a plated steel plate, or an Alodine-treated aluminum plate, usually having a thickness of 5 mm or less, a pre-coated metal can be produced as the laminate. In the case of the substrate having a thickness of more than 5 mm, the substrate may be formed before it is coated to produce a laminate.

Moreover, the use of a glass substrate for information and communication devices can produce a glass material for information and communication devices as the laminate.

Furthermore, the use of soda-lime glass or crystal glass can produce a glass material such as a cosmetic bottle, a drink bottle, or decorative glass as the laminate.

The production method described above enables the production of a laminate including a cured coating directly formed on a surface of an inorganic substrate.

The substrate may also be a transparent conductive film for use in touch panels of information and communication devices and the cured coating acts as its protective coating.

Next, embodiments of the second aspect of the present invention are described.

An inorganic substrate adhesion-improving composition for active energy ray-curable resins according to one or more embodiments of the second aspect of the present invention contains:

(A) a polymer whose main chain is a (meth)acrylic copolymer and which has, at an end of the main chain and/or at a side chain, at least one group having a silicon atom bonded to a hydrolyzable group represented by a formula (I):

$$—SiR^2{}_a(OR^1)_{3-a} \quad (I)$$

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and the symbol "a" represents an integer of 0 to 2;

(B2) a silane compound represented by a formula (II):

$$R^5N—\{X—SiR^4{}_b(OR^3)_{3-b}\}_2 \quad (II)$$

wherein X represents a divalent organic group and may contain an oxygen atom or a nitrogen atom in its structure; $R^3$, $R^4$, and $R^5$ may be the same or different, and each represents a hydrogen atom or a C1-C10 alkyl group; and the symbol "b" represents an integer of 0 to 2; and (C) a photoacid generator.

An inorganic substrate-adhesive active energy ray-curable resin composition according to one or more embodiments of the second aspect of the present invention contains the inorganic substrate adhesion-improving composition and a binder component.

<(A) Polymer Having at Least One Group Having a Silicon Atom Bonded to a Hydrolyzable Group>

The component (A) used in one or more embodiments of the second aspect of the present invention is the same as the one used in one or more embodiments of the first aspect of the present invention.

<(B) Silane Compound>

In one or more embodiments of the second aspect of the present invention, a silane compound (B2) represented by the following formula (II) is used as a silane compound (B). Use of the component (B2) can further enhance adhesion to inorganic substrates. In addition, since the amino group is protected by a relatively sterically large hydrolyzable silicon-containing group, the composition has excellent storage stability and the decrease in curability when a photoacid generator is used is small.

$$R^5N—\{X—SiR^4{}_b(OR^3)_{3-b}\}_2 \quad (II)$$

wherein X represents a divalent organic group and may contain an oxygen atom or a nitrogen atom in its structure; $R^3$, $R^4$, and $R^5$ may be the same or different, and each represents a hydrogen atom or a C1-C10 alkyl group; and the symbol "b" represents an integer of 0 to 2.

Specific examples of the silane compound (B2) include bis(alkoxyalkyl)amine compounds such as bis(trimethoxysilylpropyl)amine, bis(triethoxysilylpropyl)amine, bis(methyldimethoxysilylpropyl)amine, bis(ethyldimethoxysilylpropyl)amine, bis(dimethylmethoxysilylpropyl)amine, bis(trimethoxysilylethyl)amine, bis(triethoxysilylethyl)amine, bis(trimethoxysilylmethyl)amine, and bis(triethoxysilylmethyl)amine; bis(alkoxyalkyl)alkylamine compounds such as bis(trimethoxysilylpropyl)methylamine and bis(triethoxysilylpropyl)methylamine; and bis(alkoxysilylalkyl)amine compounds containing an oxygen atom or a nitrogen atom such as bis(trimethoxysilylethyloxyethyl)amine and bis(trimethoxysilylethylaminoethyl)amine. Preferred among these are bis(trialkoxysilylalkyl)amines such as bis(trimethoxysilylpropyl)amine and bis(triethoxysilylpropyl)amine for improved storage stability and improved adhesion to inorganic substrates.

The component (B2) may be used alone or in combinations of two or more thereof.

The amount of the component (B2) relative to 100 parts by weight of the solids content of the polymer (A) is preferably 0.1 parts by weight or more, more preferably 1 part by weight or more. At the same time, the amount is preferably 100 parts by weight or less, more preferably 50 parts by weight or less. If the amount of the component (B2) is less than 0.1 parts by weight, adhesion may be reduced in a test of long-term immersion in boiling water, or the like. If the amount is more than 100 parts by weight, the curing rate of the component (A) tends to be reduced, causing initial tack.

<(C) Photoacid Generator>

The component (C) used in one or more embodiments of the second aspect of the present invention is the same as the one used in one or more embodiments of the first aspect of the present invention.

The amount of the component (C) must be adjusted according to the yield and generation rate of the acid, but it is preferably 0.05 parts by weight or more, more preferably 0.1 parts by weight or more, relative to 100 parts by weight of the solids content of the polymer (A). At the same time, the amount is preferably 20 parts by weight or less, more preferably 10 parts by weight or less. If the amount of the component (C) is less than 0.05 parts by weight, the yield of the acid will be insufficient and the resulting coating tends to have insufficient solvent resistance and insufficient chemical resistance; while if the amount is more than 20 parts by weight, the resulting coating tends to have poor appearance and coloration.

In the inorganic substrate-adhesive active energy ray-curable resin composition according to one or more embodiments of the second aspect of the present invention, preferably, the binder component contains (D) a compound having at least two (meth)acryloyl groups per molecule, and (E) a photoradical initiator.

<(D) Compound Having at Least Two (Meth)Acryloyl Groups Per Molecule>

The component (D) used in one or more embodiments of the second aspect of the present invention is the same as the one used in one or more embodiments of the first aspect of the present invention.

The active energy ray-curable resin composition according to one or more embodiments of the second aspect of the present invention preferably contains the component (A) in an amount of 10 parts by weight or more, more preferably 20 parts by weight or more, relative to 100 parts by weight of the component (D). It also preferably contains the component (A) in an amount of 100 parts by weight or less, more preferably 80 parts by weight or more. If the amount of the component (A) is less than 10 parts by weight, sufficient adhesion tends not to be exhibited; while an amount of more than 100 parts by weight tends to result in somewhat reduced initial curability.

<(E) Photoradical Initiator>

The component (E) used in one or more embodiments of the second aspect of the present invention is the same as the one used in one or more embodiments of the first aspect of the present invention.

The active energy ray-curable resin composition according to one or more embodiments of the second aspect of the present invention may further contain the above-described photosensitizer, dehydrating agent, polymerization inhibitor, monofunctional (meth)acrylate compound, solvent, inorganic and organic pigments, plasticizer, dispersant, wetting agent, thickener, defoamer, and the like.

As described above, the water content in one or more embodiments of the curable resin composition of the present invention is preferably low. It is particularly preferred that the curable resin composition contain no water.

A method for producing a laminate according to one or more embodiments of the second aspect of the present invention includes the steps of: applying the active energy ray-curable resin composition of one or more embodiments of the second aspect of the present invention to an inorganic substrate; and curing the active energy ray-curable resin composition by irradiation with active energy rays to form a cured coating.

One or more embodiments of the second aspect of the present invention also encompasses a laminate obtained by the above production method.

The method for preparing the active energy ray-curable resin composition, the curing conditions, the inorganic substrate type, the applications, and the like are as described for one or more embodiments of the active energy ray-curable resin composition of the first aspect of the present invention.

Next, embodiments of the third aspect of the present invention are described.

An active energy ray-curable resin composition for coating organic and/or inorganic substrates according to one or more embodiments of the third aspect of the present invention contains:

(A) a polymer whose main chain is a (meth)acrylic copolymer and which has, at an end of the main chain and/or at a side chain, at least one group having a silicon atom bonded to a hydrolyzable group represented by a formula (I):

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and the symbol "a" represents an integer of 0 to 2;

(B2) a silane compound represented by a formula (II):

wherein X represents a divalent organic group and may contain an oxygen atom or a nitrogen atom in its structure; $R^3$, $R^4$, and $R^5$ may be the same or different, and each represents a hydrogen atom or a C1-C10 alkyl group; and the symbol "b" represents an integer of 0 to 2;

(C) a photoacid generator;

(D) a compound having at least two (meth)acryloyl groups per molecule; and (E) a photoradical initiator.

<(A) Polymer Having at Least One Group Having a Silicon Atom Bonded to a Hydrolyzable Group>

The component (A) used in one or more embodiments of the third aspect of the present invention is the same as the one used in one or more embodiments of the first aspect of the present invention.

<(B) Silane Compound>

The component (B) used in one or more embodiments of the third aspect of the present invention is the same as the silane compound (B2) used in one or more embodiments of the second aspect of the present invention.

The amount of the silane compound (B2) relative to 100 parts by weight of the solids content of the polymer (A) is preferably 0.1 parts by weight or more, more preferably 1 part by weight or more. At the same time, the amount is preferably 50 parts by weight or less, more preferably 30 parts by weight or less. If the amount of the silane compound (B2) is less than 0.1 parts by weight, adhesion may be reduced in a test of long-term immersion in boiling water, or the like. If the amount is more than 50 parts by weight, curing rate tends to be reduced, causing tack.

<(C) Photoacid Generator>

The component (C) used in one or more embodiments of the third aspect of the present invention is the same as the one used in one or more embodiments of the first aspect of the present invention.

<(D) Compound Having at Least Two (Meth)Acryloyl Groups Per Molecule>

The component (D) used in one or more embodiments of the third aspect of the present invention is the same as the one used in one or more embodiments of the first aspect of the present invention.

The amount of the component (D) relative to 100 parts by weight of the component (A) is preferably 1 part by weight or more, more preferably 3 parts by weight or more, still more preferably 5 parts by weight or more. At the same time, the amount is preferably 100 parts by weight or less, more preferably 70 parts by weight or less, still more preferably 50 parts by weight or less. The component (D) in an amount of less than 1 part by weight may result in insufficient adhesion to organic substrates, while an amount of more than 100 parts by weight may reduce adhesion to organic substrates, which is not preferred.

<(E) Photoradical Initiator>

The component (E) used in one or more embodiments of the third aspect of the present invention is the same as the one used in one or more embodiments of the first aspect of the present invention.

The active energy ray-curable resin composition according to one or more embodiments of the third aspect of the present invention may further contain the above-described silicon compound (F), photosensitizer, dehydrating agent, metal oxide fine particles, polymerization inhibitor, monofunctional (meth)acrylate compound, solvent, inorganic and organic pigments, plasticizer, dispersant, wetting agent, thickener, defoamer, and the like.

As described above, the water content in one or more embodiments of the curable resin composition of the present invention is preferably low. It is particularly preferred that the curable resin composition contain no water.

A method for producing a laminate according to one or more embodiments of the third aspect of the present invention includes the steps of: applying the active energy ray-curable resin composition of one or more embodiments of the third aspect of the present invention to an organic substrate and/or an inorganic substrate and/or an organic-inorganic composite substrate; and curing the active energy ray-curable resin composition by irradiation with active energy rays to form a cured coating.

One or more embodiments of the third aspect of the present invention also encompasses a laminate obtained by the above production method.

The method for preparing the active energy ray-curable resin composition, the curing conditions, the inorganic substrate type, and the applications are as described for one or more embodiments of the active energy ray-curable resin composition of the first aspect of the present invention.

Examples of the organic substrate include acrylic resins, ABS resins, polycarbonate resins, vinyl chloride resins, polyester resins such as PET, and organic coating films.

Examples of the organic-inorganic composite substrate include composite materials of the above-described organic substrates and inorganic substrates, and materials obtained by metal deposition or metal plating of organic substrates.

EXAMPLES

Embodiments of the present invention are described with reference to the examples below, but the present invention is not limited to these examples.

(Materials Used)
((A) Polymer Having at Least One Group Having a Silicon Atom Bonded to a Hydrolyzable Group)

The component (ii) in Table 1 was charged into a reaction vessel including a stirrer, a thermometer, a reflux condenser, a nitrogen gas inlet tube, and a dropping funnel, and the temperature was raised to 110° C. while nitrogen gas was introduced. Subsequently, a mixture of the components (i) in Table 1 was added dropwise through the dropping funnel at a constant rate over five hours. Then, a mixed solution of the components (iii) was added dropwise at a constant rate over one hour. Subsequently, the mixture was stirred at 110° C. for two hours, followed by cooling to room temperature. Lastly, the component (iv) in Table 1 was added and the mixture was stirred. Thus, polymers (A-1) to (A-6) were synthesized.

Table 1 shows the solids concentration, the number average molecular weight measured by GPC, and the number of groups having a silicon atom bonded to a hydrolyzable group per molecule of the obtained polymers (A-1) to (A-6). Once the polymers (A-1) to (A-6) were diluted in a polymerization solvent to a solids concentration of 50%, they were subjected to the subsequent formulation.

(Secondary and/or Tertiary Amino Group-Containing Silane Compound)

The solvent component and the components (b-1) or (b-2) in Table 2 were charged into a reaction vessel including a stirrer, a thermometer, a reflux condenser, a nitrogen gas inlet tube, and a dropping funnel while nitrogen gas was introduced, and the temperature was raised to 80° C. Subsequently, the mixture was maintained at the same temperature for a certain period described in Table 2, followed by cooling to room temperature. Thus, secondary and/or tertiary amino group-containing silane compounds (B-1) and (B-2) were synthesized.

TABLE 2

| Components (parts by weight) | | B-1 | B-2 |
|---|---|---|---|
| (b-1) | γ-Glycidoxypropyltrimethoxysilane | 35.0 | |
| | Epicoat 828 | | 18.7 |
| (b-2) | N-(2-aminoethyl)-3-aminopropyltrimethoxysilane | 15.0 | |
| | γ-Aminopropyltriethoxysilane | | 21.3 |
| Solvent | Methyl isobutyl ketone | 50.0 | 60.0 |
| Conditions | Reaction time (Hr) | 8.0 | 5.0 |
| Active ingredients (total of (b-1) and (b-2)) | | 50 | 40 |

Examples 1 to 12 and Comparative Examples 1 to 7

(Method for Preparing Curable Resin Composition)

The component (D) listed in Table 3-1 or Table 3-2, if used, was added to the polymer (A-1) to (A-5) and the mixture was mixed with a stirrer at 1000 rpm for one minute. Further, the components (B), (C), and (E) and other components were added and mixed with the stirrer at 1000 rpm for one minute, and then the solids content was adjusted to 40% using methyl isobutyl ketone. Thus, curable resin compositions were obtained. In Comparative Examples 6 and 7, a phosphate ester was used as an acid catalyst instead of the photoacid generator.

TABLE 1

| | Components (parts by weight) | A-1 | A-2 | A-3 | A-4 | A-5 | A-6 |
|---|---|---|---|---|---|---|---|
| (i) | Styrene | 0 | 3.8 | 0 | 0 | 10.0 | 3.8 |
| | Methyl methacrylate | 57.5 | 38.0 | 39.7 | 43.8 | 35.0 | 38.0 |
| | Butyl acrylate | 30.7 | 10.7 | 48.5 | 51.2 | 32.5 | 10.7 |
| | γ-Methacryloxypropyltrimethoxysilane | 11.8 | 47.5 | 11.8 | 5.0 | 22.5 | 47.5 |
| | 2,2'-Azobis(2-methylbutyronitrile) | 0.7 | 0.7 | 0.5 | 0.3 | 4.1 | 0.6 |
| | Methyl isobutyl ketone | 16.0 | 16.0 | 16.0 | 16.0 | 16.0 | 16.0 |
| (ii) | Methyl isobutyl ketone | 40.0 | 40.0 | 40.0 | 40.0 | 40.0 | 40.0 |
| (iii) | 2,2'-Azobis(2-methylbutyronitrile) | 0.1 | 0.1 | 0.1 | 0.1 | 0.4 | 0.1 |
| | Methyl isobutyl ketone | 4.0 | 4.0 | 4.0 | 4.0 | 4.0 | 4.0 |
| (iv) | Methyl orthoacetate | 3.0 | 3.0 | 3.0 | 3.0 | 3.0 | 3.0 |
| | Number average molecular weight | 15000 | 15000 | 20000 | 25000 | 6000 | 18000 |
| | Solids concentration (%) | 60.6 | 60.1 | 60.5 | 59.9 | 60.2 | 60.1 |
| | Number of groups having a silicon atom bonded to a hydrolyzable group per molecule | 7.1 | 28.7 | 9.5 | 5.0 | 5.5 | 34.5 |

TABLE 3-1

|  |  |  | Examples | | | | | |
|---|---|---|---|---|---|---|---|---|
|  |  |  | 1 | 2 | 3 | 4 | 5 | 6 |
| Components (parts by weight) | | | | | | | | |
| (A) | | A-1 | 200 | 200 | | | | |
|  | | A-2 | | | 200 | | | |
|  | | A-3 | | | | | | |
|  | | A-4 | | | | 200 | 200 | |
|  | | A-5 | | | | | | 200 |
| (B) | | Bis(trimethoxysilylpropyl)amine | 1 | 10 | 1.5 | | | |
|  | | Bis(triethoxysilylpropyl)amine | | | | | 3 | |
|  | | B-1 | | | | 6 | | |
|  | | B-2 | | | | | | 12 |
| (C) | | CPI-100P | 1 | 3 | 1 | 3 | | 3 |
|  | | CPI-101A | | | | | 3 | |
| (D) | | Pentaerythritol triacrylate | | | | | | |
|  | | Dipentaerythritol hexaacrylate | | | | | | |
|  | | NK Oligo U-6LPA | | | | | | |
| (E) | | DAROCUR 1173 | | | | | | |
|  | | IRGACURE 184 | | | | | | |
| Others | | AP-8 | | | | | | |
|  | | MS56 | | | | | 10 | |
|  | | γ-Aminopropyltrimethoxysilane | | | | | | |
|  | | γ-Mercaptopropyltrimethoxysilane | | | | | | |
|  | | p-Methoxyphenol | | | | | | |
| Curing conditions | | | UV curing (600 mJ/cm2), EB curing (150 kV, 50 kGy) | | | | | |
| Physical properties | Hardness | Pencil hardness | F | H | 2H | B | B | F |
|  | Adhesion (primary/secondary) UV curing or drying | Soda-lime glass | 100/100 | 100/100 | 100/100 | 100/100 | 100/100 | 100/100 |
|  |  | Aluminum silicate glass | 100/100 | 100/100 | 100/100 | 100/100 | 100/100 | 100/100 |
|  |  | Aluminum plate (A1050P) | 100/100 | 100/100 | 100/100 | 100/100 | 100/100 | 100/100 |
|  |  | Aluminum plate (A5052P) | 100/100 | 100/100 | 100/100 | 100/100 | 100/100 | 100/100 |
|  |  | Alodine-treated aluminum plate | 100/100 | 100/100 | 100/100 | 100/100 | 100/100 | 100/100 |
|  |  | Hot-dip galvanized steel plate | 100/100 | 100/100 | 100/100 | 100/100 | 100/100 | 100/100 |
|  |  | SUS304 | 100/100 | 100/100 | 100/100 | 100/100 | 100/100 | 100/100 |
|  | Adhesion (primary/secondary) EB curing | Soda-lime glass | 100/100 | 100/100 | 100/100 | 100/100 | 100/100 | 100/100 |
|  |  | Aluminum plate (A1050P) | 100/100 | 100/100 | 100/100 | 100/100 | 100/100 | 100/100 |
|  |  | Aluminum plate (A5052P) | 100/100 | 100/100 | 100/100 | 100/100 | 100/100 | 100/100 |
|  |  | Alodine-treated aluminum plate | 100/100 | 100/100 | 100/100 | 100/100 | 100/100 | 100/100 |
|  |  | Hot-dip galvanized steel plate | 100/100 | 100/100 | 100/100 | 100/100 | 100/100 | 100/100 |
|  |  | SUS304 | 100/100 | 100/100 | 100/100 | 100/100 | 100/100 | 100/100 |
|  | Glass protection | Aluminum silicate glass | A | — | — | AA | — | — |
|  | Flexibility | T-bend | 5T | 7T | 7T | 3T | 3T | 5T |
|  | Weather resistance | Gloss retention (%) | 91 | 93 | 95 | 87 | 87 | 91 |
|  |  | ΔYI | 0.2 | 0.4 | 0.2 | 0.5 | 0.8 | 1.0 |
|  |  | ΔE | 0.3 | 0.3 | 0.2 | 0.8 | 0.8 | 1.2 |
|  | Storage stability (ratio) | | 1.1 | 1.3 | 1.1 | 1.4 | 1.1 | 1.2 |

|  |  |  | Examples | | | | | |
|---|---|---|---|---|---|---|---|---|
|  |  |  | 7 | 8 | 9 | 10 | 11 | 12 |
| Components (parts by weight) | | | | | | | | |
| (A) | | A-1 | 100 | 80 | 80 | | 40 | 40 |
|  | | A-2 | | | | 80 | | |
|  | | A-3 | 100 | 80 | 80 | | 160 | |
|  | | A-4 | | | | 80 | | 140 |
|  | | A-5 | | | | | | |
| (B) | | Bis(trimethoxysilylpropyl)amine | | | | 2 | | |
|  | | Bis(triethoxysilylpropyl)amine | | | | | | |
|  | | B-1 | 10 | 10 | | 20 | 10 | 10 |
|  | | B-2 | | | | | | |
| (C) | | CPI-100P | 1 | 3 | 1 | 1 | 3 | 3 |
|  | | CPI-101A | | | | | | |
| (D) | | Pentaerythritol triacrylate | | 20 | | | | 10 |
|  | | Dipentaerythritol hexaacrylate | | | 20 | | | |
|  | | NK Oligo U-6LPA | | | | 20 | | |
| (E) | | DAROCUR 1173 | | 0.4 | | 0.4 | | |
|  | | IRGACURE 184 | | 0.8 | 1.2 | 0.8 | | 1.2 |
| Others | | AP-8 | | | | | | |
|  | | MS56 | | | | | | |
|  | | γ-Aminopropyltrimethoxysilane | | | | 3 | | |
|  | | γ-Mercaptopropyltrimethoxysilane | | | | | | |
|  | | p-Methoxyphenol | | 0.05 | 0.05 | 0.03 | | 0.03 |

TABLE 3-1-continued

| | Curing conditions | | UV curing (600 mJ/cm2), EB curing (150 kV, 50 kGy) | | | | | |
|---|---|---|---|---|---|---|---|---|
| Physical properties | Hardness | Pencil hardness | H | H | H | 2H | B | B |
| | Adhesion (primary/secondary) UV curing or drying | Soda-lime glass | 100/100 | 100/100 | 100/100 | 100/100 | 100/100 | 100/100 |
| | | Aluminum silicate glass | 100/100 | 100/100 | 100/100 | 100/100 | 100/100 | 100/100 |
| | | Aluminum plate (A1050P) | 100/100 | 100/100 | 100/100 | 100/100 | 100/100 | 100/100 |
| | | Aluminum plate (A5052P) | 100/100 | 100/100 | 100/100 | 100/100 | 100/100 | 100/100 |
| | | Alodine-treated aluminum plate | 100/100 | 100/100 | 100/100 | 100/100 | 100/100 | 100/100 |
| | | Hot-dip galvanized steel plate | 100/100 | 100/100 | 100/100 | 100/100 | 100/100 | 100/100 |
| | | SUS304 | 100/100 | 100/100 | 100/100 | 100/100 | 100/100 | 100/100 |
| | Adhesion (primary/secondary) EB curing | Soda-lime glass | 100/100 | 100/100 | 100/100 | 100/100 | 100/100 | 100/100 |
| | | Aluminum plate (A1050P) | 100/100 | 100/100 | 100/100 | 100/100 | 100/100 | 100/100 |
| | | Aluminum plate (A5052P) | 100/100 | 100/100 | 100/100 | 100/100 | 100/100 | 100/100 |
| | | Alodine-treated aluminum plate | 100/100 | 100/100 | 100/100 | 100/100 | 100/100 | 100/100 |
| | | Hot-dip galvanized steel plate | 100/100 | 100/100 | 100/100 | 100/100 | 100/100 | 100/100 |
| | | SUS304 | 100/100 | 100/100 | 100/100 | 100/100 | 100/100 | 100/100 |
| | Glass protection | Aluminum silicate glass | A | A | — | — | AA | AA |
| | Flexibility | T-bend | 3T | 3T | 3T | 3T | 3T | 3T |
| | Weather resistance | Gloss retention (%) | 92 | 87 | 85 | 90 | 92 | 88 |
| | | ΔYI | 0.3 | 1.8 | 1.5 | 0.9 | 1.2 | 1.4 |
| | | ΔE | 0.3 | 1.6 | 1.6 | 1.4 | 1.2 | 0.7 |
| | Storage stability (ratio) | | 1.1 | 1.4 | 1.2 | 1.4 | 1.3 | 1.1 |

TABLE 3-2

| | | | Comparative Examples | | | | | | |
|---|---|---|---|---|---|---|---|---|---|
| | | | 1 | 2 | 3 | 4 | 5 | 6 | 7 |
| | Components (parts by weight) | | | | | | | | |
| (A) | | A-1 | 200 | 200 | 200 | 200 | | 200 | 200 |
| | | A-2 | | | | | | | |
| | | A-3 | | | | | | | |
| | | A-4 | | | | | | | |
| | | A-5 | | | | | | | |
| (B) | | Bis(trimethoxysilylpropyl)amine | | | | | 3 | 3 | 3 |
| | | Bis(triethoxysilylpropyl)amine | | | | | | | |
| | | B-1 | | | | | | | |
| | | B-2 | | | | | | | |
| (C) | | CPI-100P | 3 | 3 | 3 | 3 | | | |
| | | CPI-101A | | | | | | | |
| (D) | | Pentaerythritol triacrylate | | | | | | | |
| | | Dipentaerythritol hexaacrylate | | | | | | | |
| | | NK Oligo U-6LPA | | | | | 100 | | |
| (E) | | DAROCUR 1173 | | | | | | | |
| | | IRGACURE 184 | | | | | 8 | | |
| Others | | AP-8 | | | | | | 3 | 3 |
| | | MS56 | 10 | | | | | | |
| | | γ-Aminopropyltrimethoxysilane | | 5 | | | | | |
| | | γ-Mercaptopropyltrimethoxysilane | | | 5 | | | | |
| | | p-Methoxyphenol | | | | 0.05 | | | |

| | Curing conditions | | UV curing (600 mJ/cm2), EB curing (150 kV, 50 kGy) | | | | | Room temperature | Baking |
|---|---|---|---|---|---|---|---|---|---|
| Physical properties | Hardness | Pencil hardness | F | F | F | F | 3H | 6B or lower | F |
| | Adhesion (primary/secondary) UV curing or drying | Soda-lime glass | 100/0 | 100/100 | 100/100 | 100/100 | 0/0 | 50/0 | 100/0 |
| | | Aluminum silicate glass | 100/100 | 100/100 | 100/100 | 100/100 | 0/0 | 50/0 | 100/30 |
| | | Aluminum plate (A1050P) | 100/0 | 100/100 | 100/100 | 100/50 | 0/0 | 30/0 | 50/0 |
| | | Aluminum plate (A5052P) | 100/0 | 100/100 | 100/100 | 100/100 | 100/0 | 100/50 | 100/50 |
| | | Alodine-treated Aluminum plate | 0/0 | 100/0 | 100/0 | 100/0 | 0/0 | 0/0 | 0/0 |
| | | Hot-dip galvanized steel plate | 0/0 | 0/0 | 100/0 | 100/0 | 0/0 | 30/0 | 0/0 |
| | | SUS304 | 0/0 | 100/0 | 100/0 | 100/0 | 0/0 | 30/0 | 50/0 |
| | Adhesion (primary/secondary) EB curing | Soda-lime glass | 100/100 | 100/100 | 100/100 | 100/100 | 100/50 | — | — |
| | | Aluminum plate (A1050P) | 100/0 | 100/100 | 100/100 | 100/50 | 0/0 | — | — |
| | | Aluminum plate (A5052P) | 100/100 | 100/100 | 100/100 | 100/100 | 100/0 | — | — |
| | | Alodine-treated Aluminum plate | 0/0 | 100/0 | 100/0 | 100/0 | 0/0 | — | — |
| | | Hot-dip galvanized steel plate | 0/0 | 100/0 | 100/0 | 100/0 | 0/0 | — | — |
| | | SUS304 | 0/0 | 100/0 | 100/0 | 100/0 | 0/0 | — | — |
| | Glass protection | Aluminum silicate glass | A | B | B | — | Not adhered | Insufficient adhesion | Insufficient adhesion |

TABLE 3-2-continued

| | | Comparative Examples | | | | | | |
|---|---|---|---|---|---|---|---|---|
| | | 1 | 2 | 3 | 4 | 5 | 6 | 7 |
| Flexibility | T-bend | Not evaluated because no secondary adhesion was observed | | | | | | |
| Weather resistance | Gloss retention (%) | 92 | 94 | 94 | 92 | Cracks occurred after 1000 hours | Not evaluated | 92 |
| | ΔYI | 0.2 | 0.2 | 0.6 | 0.6 | | | 1.2 |
| | ΔE | 0.2 | 0.2 | 0.7 | 0.9 | | | 1.4 |
| Storage stability (ratio) | | 1.1 | 1.0 | Gelated | 1.0 | 1.2 | Gelated | Gelated |

CPI-100P: a solution of triarylsulfonium.$PF_6$ salt in propylene carbonate available from San-Apro Ltd.
CPI-101A: a solution of triarylsulfonium.$SbF_6$ salt in propylene carbonate available from San-Apro Ltd.
NK Oligo U-6LPA: polyfunctional urethane acrylate available from Shin Nakamura Chemical Co., Ltd.
DAROCUR 1173: 2-hydroxy-2-methyl-1-phenylpropan-1-one available from BASF
IRGACURE 184: 1-hydroxycyclohexyl phenyl ketone available from BASF
AP-8: an acidic phosphate ester available from Daihachi Chemical Industry Co., Ltd.
MS56: a condensate of tetramethoxysilane ($SiO_2$ content: 52% by weight) available from Mitsubishi Chemical Corporation (Evaluation of Physical Properties)

Curing Conditions

Except for Comparative Examples 6 and 7, each curable resin composition was applied to the substrates listed in Table 3-1 or Table 3-2 with a bar coater to a dry film thickness of about 20 μm, and dried at 80° C. for two minutes to remove the solvent, followed by curing by ultraviolet (UV) irradiation using a high pressure mercury lamp in the air at 150 mW to a cumulative dose of light having a wavelength of 310 to 390 nm of 600 mJ/$cm^2$. Thus, test pieces were prepared.

An electron beam irradiation apparatus (CB250/30/20 mA available from Iwasaki Electric Co., Ltd.) was also used to cure the compositions by electron beam (EB) irradiation of 50 kGy at an accelerating voltage of 150 kV. Thus, test pieces were prepared.

On the other hand, in Comparative Example 6, the composition was dried at room temperature for 7 days; in Comparative Example 7, the composition was dried at 100° C. for 20 minutes (baking), whereby test pieces were prepared.

Hardness

Seven days after UV irradiation, pencil hardness was evaluated at a load of 1 Kg in accordance with JIS K5400.

Adhesion (Cross Cut Adhesion Test)

Except for Comparative Examples 6 and 7, one day after UV irradiation or EB irradiation, a cross cut adhesion test at 1 mm intervals was carried out in accordance with JIS K5600 (primary adhesion). Further, the test pieces were immersed in boiling water for one hour, and adhesion immediately after removal therefrom was also evaluated (secondary adhesion).

In Comparative Examples 6 and 7, evaluation was carried out in the same manner after the compositions were dried and cured.

Glass Protection

Each composition was applied to an aluminum silicate glass (0.5 mm thick) and UV-irradiated to prepare a test plate. An iron ball (22 g) was vertically raised to a height of 15 cm and dropped onto the test piece. The test was performed with n=5 and the results were evaluated based on the following criteria.

The letters AA and A indicate acceptable results.
AA: One or less glass plates out of five were broken.
A: Two or more glass plates out of five were broken, but broken glass did not scatter.
B: Two or more glass plates out of five were broken, and broken glass scattered.
Not evaluated Flexibility (T-Bend)

The UV-irradiated test pieces (Alodine-treated aluminum plate) tested for secondary cross cut adhesion were bent at 180 degrees to sandwich each of spacers corresponding to various thicknesses in accordance with JIS K5400. The coatings were then observed for cracking and peeling and the results were displayed as nT, wherein the thickness of the spacer with which no issues were found was n times the thickness of the test piece. A smaller n value indicates better processability.

Weather Resistance

Test plates were prepared by UV irradiation of an aluminum plate (A5052P). These test plates were evaluated for accelerated weather resistance using a sunshine weatherometer (S80 available from Suga Test Instruments Co., Ltd.) in accordance with JIS K5400 at a black panel temperature of 63±3° C. and a water spray time of 18 minutes for every 120 minutes of irradiation. Table 3-1 and Table 3-2 show the 60° gloss retention (%), yellowing (ΔYI), and coloration (ΔE) after 3000 hours of testing.

Storage Stability

The curable resin compositions were put in brown bottles, and the viscosity was measured with a B-type viscometer (initial viscosity). Subsequently, nitrogen was inserted into the bottles, which were then hermetically closed. After the bottles were allowed to stand for two weeks at 50° C., the B-type viscosity was measured again (viscosity after storage). Table 3-1 and Table 3-2 show the thickening ratio [(viscosity after storage)/(initial viscosity)] as storage stability.

In Examples 1 to 12, high adhesion to various inorganic substrates was exhibited. The compositions strongly adhered to an Alodine-treated aluminum plate and a hot-dip galvanized steel plate which are commonly used in PCM (precoated metal) applications, and the compositions also possessed sufficient post-processability with a flexibility value of 3 T to 7 T. Moreover, as shown in Examples 4, 11, and 12, some compositions had an effect of suppressing crushing and scattering of glass when impact was applied to the glass. Furthermore, as for weather resistance, the compositions maintained high gloss retention, had very small changes in color tone and thus maintained the initial appearance even after 3000 hours of testing. In contrast, in Comparative Examples 1 to 4 in which the compositions contained no secondary and/or tertiary amino group-containing silane compound component, and in Comparative Example 5 in which the composition contained no polymer (A), they could not adhere to many inorganic substrates. Also in Comparative Example 5, sufficient weather resistance was not achieved and the coating was cracked after a lapse of 1000 hours. In Comparative Examples 6 and 7 in which no photoacid generator was used as an acid catalyst, adhesion to a wide range of inorganic substrates was not achieved.

As described above, the active energy ray-curable compositions of the present invention containing: (A) a polymer having at least one group having a silicon atom bonded to a hydrolyzable group; (B1) a secondary and/or tertiary amino group-containing silane compound; and (C) a photoacid generator were quickly cured by irradiation with active energy rays. In addition, the compositions were found to be active energy ray-curable coating agents that adhere very well to glass and metal substrates and can directly coat inorganic substrates. They were excellent in hardness and processability and thus found be coating agents suitable for use even in PCM applications.

Examples 13 to 22 and Comparative Examples 8 to 11

(Method for Preparing Curable Resin Composition)

To the component (D) in Table 4, the component (A) was added and mixed with a stirrer at 1000 rpm for one minute. Further, the components (B), (C), and (E) and other components were added and mixed with the stirrer at 1000 rpm for one minute, and then the solids content was adjusted to 40% using methyl isobutyl ketone. Thus, curable resin compositions were obtained.

TABLE 4

| | | | Examples | | | | | | |
|---|---|---|---|---|---|---|---|---|---|
| | | | 13 | 14 | 15 | 16 | 17 | 18 | 19 |
| Components (parts by weight) | | | | | | | | | |
| (A) | | A-1 | 100 | 60 | 40 | | | 30 | 60 |
| | | A-4 | | | | | 40 | 30 | |
| | | A-6 | | | | 60 | | | |
| (B) | | Bis(trimethoxysilylpropyl)amine | 3 | 3 | 3 | | 6 | 5 | 3 |
| | | Bis(triethoxysilylpropyl)amine | | | | 3 | | | |
| (C) | | CPI-100P | 2 | 1 | 0.5 | 1 | 1.5 | 1.5 | 1 |
| (D) | | Pentaerythritol triacrylate | | | | | | | 70 |
| | | Dipentaerythritol hexaacrylate | | | | | | | |
| | | NK Oligo U-6LPA | 50 | 70 | 80 | | 60 | 70 | |
| | | NK Oligo UA-122P | | | | 70 | | | |
| (E) | | DAROCUR 1173 | 0.8 | 1.2 | 1.5 | | | 1.2 | |
| | | IRGACURE 184 | 1.6 | 2.4 | 3 | 5.4 | 3 | 2.4 | 3 |
| Others | | γ-Aminopropyltrimethoxysilane | | | | | | | |
| | | p-Methoxyphenol | 0.05 | 0.05 | 0.05 | 0.05 | 0.05 | 0.05 | 0.05 |
| Curing conditions | | | UV curing (600 mJ/cm2) | | | | | | |
| Physical properties | Hardness | Pencil hardness | 2H | 3H | 3H | 3H | 2H | 3H | 2H |
| | Solvent resistance | Methyl ethyl ketone | Good | Good | Good | Good | Good | Good | Good |
| | | Xylene | Good | Good | Good | Good | Good | Good | Good |
| | Adhesion (primary/secondary) | Glass plate | 100/100 | 100/100 | 80/100 | 100/100 | 80/100 | 100/100 | 100/100 |
| | | Aluminum plate (A1050P) | 100/100 | 100/100 | 80/100 | 100/100 | 60/100 | 100/100 | 100/100 |
| | | Aluminum plate (A5052P) | 100/100 | 100/100 | 100/100 | 100/100 | 100/100 | 100/100 | 100/100 |
| | | Alodine-treated aluminum plate | 100/100 | 100/100 | 100/80 | 100/100 | 80/60 | 100/80 | 100/100 |
| | Storage stability | Thickening ratio | 1.3 | 1.0 | 1.0 | 1.3 | 1.3 | 1.2 | 1.1 |

| | | | Examples | | | Comparative Examples | | | |
|---|---|---|---|---|---|---|---|---|---|
| | | | 20 | 21 | 22 | 8 | 9 | 10 | 11 |
| Components (parts by weight) | | | | | | | | | |
| (A) | | A-1 | | 30 | | 60 | 60 | | |
| | | A-4 | | 30 | 60 | | | | |
| | | A-6 | 40 | | | | | | |
| (B) | | Bis(trimethoxysilylpropyl)amine | 3 | 3 | 5 | | | 5 | 5 |
| | | Bis(triethoxysilylpropyl)amine | | | | | | | |
| (C) | | CPI-100P | 0.5 | 1 | 1.5 | 1 | 1 | 1 | 1 |
| (D) | | Pentaerythritol triacrylate | 80 | | | | | | |
| | | Dipentaerythritol hexaacrylate | | 70 | 70 | 70 | 70 | 100 | |
| | | NK Oligo U-6LPA | | | | | | | 100 |
| | | NK Oligo UA-122P | | | | | | | |
| (E) | | DAROCUR 1173 | | | | | | | |
| | | IRGACURE 184 | 5 | 3 | 3 | 3 | 3 | 8 | 8 |
| Others | | γ-Aminopropyltrimethoxysilane | | | | | 5 | | |
| | | p-Methoxyphenol | 0.05 | 0.05 | 0.05 | 0.05 | 0.05 | 0.05 | 0.05 |
| Curing conditions | | | UV curing (600 mJ/cm2) | | | | | | |
| Physical properties | Hardness | Pencil hardness | 2H | 3H | 3H | 2H | 2H | 4H | 4H |
| | Solvent resistance | Methyl ethyl ketone | Good | Good | Good | Good | Good | Good | Good |
| | | Xylene | Good | Good | Good | Good | Good | Good | Good |

TABLE 4-continued

| | | | | | | | | |
|---|---|---|---|---|---|---|---|---|
| Adhesion (primary/secondary) | Glass plate | 80/100 | 100/100 | 100/100 | 100/0 | 100/0 | 0/0 | 0/0 |
| | Aluminum plate (A1050P) | 100/100 | 100/100 | 100/100 | 0/0 | 0/0 | 0/0 | 0/0 |
| | Aluminum plate (A5052P) | 100/100 | 100/100 | 100/100 | 100/0 | 100/0 | 100/0 | 100/0 |
| | Alodine-treated aluminum plate | 100/100 | 100/100 | 100/100 | 0/0 | 0/0 | 0/0 | 0/0 |
| Storage stability | Thickening ratio | 1.2 | 1.2 | 1.3 | 1.5 | Gelated | 1.0 | 1.1 |

NK Oligo UA-122P: polyfunctional urethane acrylate available from Shin Nakamura Chemical Co., Ltd.

(Evaluation of Physical Properties)

Curing Conditions

The curable resin compositions in Table 4 were applied to the substrates listed in Table 4 with a bar coater to a dry film thickness of about 15 μm, and dried at 80° C. for two minutes to remove the solvent, followed by curing by irradiation with active energy rays using a high pressure mercury lamp in the air at 150 mW to a cumulative dose of light having a wavelength of 310 to 390 nm of 600 mJ/cm$^2$. Thus, test pieces were prepared.

Hardness

Seven days after irradiation, pencil hardness was evaluated at a load of 1 Kg in accordance with JIS K5400.

Solvent Resistance

Test plates obtained by applying the compositions to glass plates were irradiated with active energy rays. Immediately after irradiation, methyl ethyl ketone or xylene was spotted on the test plates, which were then allowed to stand at room temperature. After 30 minutes, the test plates were washed with water and the coating conditions were observed.

Adhesion (Cross Cut Adhesion Test)

Evaluation was carried out under the conditions described above.

Storage Stability

Evaluation was carried out under the conditions described above.

In Examples 13 to 22, the compositions were immediately cured by irradiation with active energy rays and exhibited high adhesion to various inorganic substrates. Good adhesion was exhibited also to poorly adherent inorganic substrates such as an untreated aluminum plate (A1050P) and an Alodine-treated aluminum plate. The compositions also showed high hardness and high solvent resistance from the initial stage of irradiation. The results also showed no issues in storage stability.

In contrast, adhesion to inorganic substrates was insufficient in Comparative Example 8 in which no component (B) was used, Comparative Example 9 in which a silane compound other than the component (B) was used, and Comparative Examples 10 and 11 in which no component (A) was used.

The results as described above show that by adding an inorganic substrate adhesion-improving composition containing a polymer (A), a specific silane compound (B), and a photoacid generator (C) to a binder containing (D) a compound having at least two (meth)acryloyl groups per molecule and (E) a photoradical initiator, good adhesion to glass and metal substrates was achieved. Thus, the inorganic substrate adhesion-improving compositions of the present invention were found to be good inorganic substrate adhesion-promoting compositions.

Examples 23 to 33 and Comparative Examples 12 to 14

(Method for Preparing Curable Resin Composition)

The component (D) in Table 5 was added to the component (A) and mixed with a stirrer at 1000 rpm for one minute. Further, the components (B), (C), and (E) and other components were added and mixed with the stirrer at 1000 rpm for one minute, and then the solids content was adjusted to 40% using methyl isobutyl ketone. Thus, curable resin compositions were obtained.

TABLE 5

| | | | Examples | | | | | | |
|---|---|---|---|---|---|---|---|---|---|
| | | | 23 | 24 | 25 | 26 | 27 | 28 | 29 |
| Components (parts by weight) | | | | | | | | | |
| (A) | | A-1 | 200 | 200 | | | | 100 | 100 |
| | | A-2 | | | 200 | | | | |
| | | A-3 | | | | | | 100 | 100 |
| | | A-4 | | | | 200 | | | |
| | | A-5 | | | | | 200 | | |
| (B) | | Bis(trimethoxysilylpropyl)amine | 3 | 3 | 1.5 | 10 | | 3 | 3 |
| | | Bis(triethoxysilylpropyl)amine | | | | | 3 | | |
| (C) | | CPI-100P | 1 | 1 | | 3 | | 3 | 3 |
| | | CPI-101A | | | 1 | | 1 | | |
| (D) | | Dipentaerythritol hexaacrylate | | | | 30 | | | |
| | | NK Oligo U-6LPA | 5 | 50 | | | 30 | 50 | 70 |
| | | NK Oligo UA-122P | | | 20 | | | | |
| (E) | | DAROCUR 1173 | | 1 | | 0.5 | 0.5 | 1.5 | 2 |
| | | IRGACURE 184 | 1 | 2 | 1.5 | 1 | 1 | 3 | 4 |
| Others | | p-Methoxyphenol | | | 0.03 | | 0.03 | 0.03 | 0.04 |
| Curing conditions | | | UV curing (600 mJ/cm2) | | | | | | |
| Physical properties | Curability | Initial tack | A | A | A | B | A | A | A |
| | Hardness | Pencil hardness | HB | H | H | F | F | 2H | 2H |
| | Adhesion (primary/secondary) | Glass plate | 100/100 | 100/100 | 100/100 | 100/100 | 100/100 | 100/100 | 100/100 |
| | | Aluminum plate (A1050P) | 100/100 | 100/100 | 100/100 | 100/100 | 100/100 | 100/100 | 100/100 |

TABLE 5-continued

|  |  |  |  |  |  |  |  |  |
|---|---|---|---|---|---|---|---|---|
| to inorganic substrates | Aluminum plate (A5052P) | 100/100 | 100/100 | 100/100 | 100/100 | 100/100 | 100/100 | 100/100 |
|  | Alodine-treated aluminum plate | 100/100 | 100/100 | 100/100 | 100/100 | 100/100 | 100/100 | 100/100 |
|  | Hot-dip galvanized steel plate | 100/100 | 100/100 | 100/100 | 100/100 | 100/100 | 100/100 | 100/100 |
|  | SUS304 | 100/100 | 100/100 | 100/100 | 100/100 | 100/100 | 100/100 | 100/100 |
| Adhesion (primary/secondary) to organic substrates | PMMA plate | 100/100 | 100/100 | 100/100 | 100/100 | 100/100 | 100/100 | 100/100 |
|  | PC plate | 100/100 | 100/100 | 100/100 | 100/100 | 100/100 | 100/100 | 100/100 |
|  | PVC plate | 100/100 | 100/100 | 100/100 | 100/100 | 100/100 | 100/100 | 100/100 |
|  | Modified PPE plate | 100/100 | 100/100 | 100/80 | 100/100 | 100/80 | 100/100 | 100/80 |
|  | PPO plate | 100/100 | 100/100 | 100/80 | 100/100 | 100/100 | 100/100 | 100/100 |
|  | PET plate | 100/100 | 100/100 | 100/100 | 100/100 | 100/100 | 100/100 | 100/100 |
|  | Colored steel plate | 100/100 | 100/100 | 100/100 | 100/100 | 100/100 | 100/100 | 100/100 |
| Re-coating adhesion (primary/secondary) |  | 100/100 | 100/100 | 100/80 | 100/100 | 100/100 | 100/100 | 100/100 |
| Weather resistance | Gloss retention (%) | 95 | 88 | 95 | 89 | 92 | 85 | 80 |
|  | ΔYI | 0.2 | 0.4 | 0.2 | 0.5 | 0.8 | 1.0 | 1.5 |
|  | ΔE | 0.3 | 0.3 | 0.2 | 0.2 | 0.3 | 1.2 | 1.7 |

|  |  |  | Examples |  |  |  | Comparative Examples |  |  |
|---|---|---|---|---|---|---|---|---|---|
|  |  |  | 30 | 31 | 32 | 33 | 12 | 13 | 14 |
| Components (parts by weight) |  |  |  |  |  |  |  |  |  |
| (A) |  | A-1 |  | 100 | 100 |  | 200 |  |  |
|  |  | A-2 | 100 |  |  | 200 |  |  |  |
|  |  | A-3 |  |  | 100 |  |  |  |  |
|  |  | A-4 | 100 | 100 |  |  |  |  |  |
|  |  | A-5 |  |  |  |  |  |  |  |
| (B) |  | Bis(trimethoxysilylpropyl)amine | 5 | 3 | 3 | 3 |  |  | 3 |
|  |  | Bis(triethoxysilylpropyl)amine |  |  |  |  |  |  |  |
| (C) |  | CPI-100P | 3 | 3 | 1 | 3 | 3 |  |  |
|  |  | CPI-101A |  |  |  |  |  |  |  |
| (D) |  | Dipentaerythritol hexaacrylate |  |  | 70 |  | 50 |  |  |
|  |  | NK Oligo U-6LPA | 30 | 90 |  |  |  | 100 | 100 |
|  |  | NK Oligo UA-122P |  |  |  |  |  |  |  |
| (E) |  | DAROCUR 1173 |  | 1.5 |  |  |  | 2 |  |
|  |  | IRGACURE 184 | 4.5 | 3 | 3 |  | 3 | 3 | 8 |
| Others |  | p-Methoxyphenol | 0.03 | 0.05 | 0.03 |  |  | 0.05 | 0.05 |
| Curing conditions |  |  | UV curing (600 mJ/cm2) |  |  |  |  |  |  |
| Physical properties | Curability | Initial tack | A | A | A | C | A | A | A |
|  | Hardness | Pencil hardness | H | 3H | 3H | B | F | 3H | 3H |
|  | Adhesion (primary/secondary) to inorganic substrates | Glass plate | 100/100 | 100/100 | 100/100 | 100/100 | 100/50 | 0/0 | 0/0 |
|  |  | Aluminum plate (A1050P) | 100/100 | 100/100 | 100/100 | 100/100 | 100/50 | 0/0 | 0/0 |
|  |  | Aluminum plate (A5052P) | 100/100 | 100/100 | 100/100 | 100/100 | 100/100 | 0/0 | 100/0 |
|  |  | Alodine-treated aluminum plate | 100/100 | 100/100 | 100/100 | 100/100 | 100/0 | 0/0 | 0/0 |
|  |  | Hot-dip galvanized steel plate | 100/100 | 100/100 | 100/100 | 100/100 | 100/0 | 0/0 | 0/0 |
|  |  | SUS304 | 100/100 | 100/100 | 100/100 | 100/100 | 100/50 | 0/0 | 0/0 |
|  | Adhesion (primary/secondary) to organic substrates | PMMA plate | 100/100 | 100/100 | 100/100 | 100/100 | 100/100 | 100/100 | 100/100 |
|  |  | PC plate | 100/100 | 100/100 | 100/100 | 100/50 | 100/80 | 100/0 | 100/0 |
|  |  | PVC plate | 100/100 | 100/100 | 100/100 | 100/100 | 100/100 | 100/80 | 100/100 |
|  |  | Modified PPE plate | 100/100 | 80/50 | 100/80 | 100/0 | 100/50 | 0/0 | 0/0 |
|  |  | PPO plate | 100/100 | 100/80 | 100/80 | 100/50 | 100/50 | 0/0 | 0/0 |
|  |  | PET plate | 100/100 | 100/100 | 100/100 | 100/100 | 100/100 | 100/100 | 100/100 |
|  |  | Colored steel plate | 100/100 | 100/100 | 100/100 | 100/100 | 100/0 | 100/50 | 100/80 |
|  | Re-coating adhesion (primary/secondary) |  | 100/100 | 100/80 | 100/80 | 100/100 | 100/80 | 0/0 | 0/0 |
|  | Weather resistance | Gloss retention (%) | 90 | 80 | 81 | 98 | 84 | Cracks occurred after 1000 hours |  |
|  |  | ΔYI | 0.8 | 1.8 | 1.6 | 0.2 | 0.2 |  |  |
|  |  | ΔE | 0.5 | 2.5 | 2.1 | 0.2 | 0.2 |  |  |

PMMA plate: Comoglass available from Kuraray Co., Ltd.
PC plate: PC1600 available from Takiron Co., Ltd.
PVC plate: PVC plate available from Takiron Co., Ltd.
Modified PPE plate: XYRON available from Asahi Kasei Corp.
PPO plate: Noryl available from GE Plastics Japan Ltd.
PET plate: PETEC available from Takiron Co., Ltd.
(Evaluation of Physical Properties)
Curing Conditions
The curable resin compositions in Table 5 were applied to the substrates listed in Table 5 with a bar coater to a dry film thickness of about 15 μm, and dried at 80° C. for two minutes to remove the solvent, followed by curing by irradiation with active energy rays using a high pressure mercury lamp in the air at 150 mW to a cumulative dose of light having a wavelength of 310 to 390 nm of 600 mJ/cm$^2$. Thus, test pieces were prepared.

Curability

Immediately after irradiation, the coatings were strongly pressed with a finger to evaluate curability (initial tack) based on the following criteria.

A: No changes in appearance were observed.
B: Slight fingerprint marks were left.
C: Clear fingerprint marks were left.

Hardness

Seven days after irradiation, pencil hardness was evaluated at a load of 1 Kg in accordance with JIS K5400.

Adhesion (Cross Cut Adhesion Test)

One day after irradiation, a cross cut adhesion test at 1 mm intervals was carried out in accordance with JIS K5600

(primary adhesion). Further, in the case of the inorganic substrates and the colored steel plates, they were immersed in boiling water for one hour, and adhesion immediately after removal therefrom was also evaluated as secondary adhesion. In the case of the PMMA (acrylic), PC (polycarbonate), PVC (polyvinyl chloride), modified PPE (polyphenylene ether), and PPO (polyphenylene oxide) substrates, they were allowed to stand at 85° C. and 85% RH for 24 hours and adhesion was then evaluated as secondary adhesion. In the case of the PET substrate, they were allowed to stand at 60° C. and 80% RH for 24 hours and adhesion was then evaluated as secondary adhesion.

Re-Coating Adhesion (Suitability for Primer Coating)

Each curable resin composition was applied to an aluminum plate (A5052P) and UV-irradiated to prepare a test piece, which was then allowed to stand at 23° C. for one month. Then, the same curable resin composition was applied to the resulting coating surface and cured by irradiation by the same methods under the same curing conditions to prepare a test piece for re-coating adhesion.

One day after irradiation, a cross cut adhesion test at 1 mm intervals was carried out in accordance with JIS K5600 (primary test). Further, the test pieces were immersed in boiling water for one hour, and adhesion immediately after removal therefrom was evaluated (secondary test).

Weather Resistance

Test plates prepared from aluminum plates (A5052P) were evaluated for accelerated weather resistance using a sunshine weatherometer (S80 available from Suga Test Instruments Co., Ltd.) in accordance with JIS K5400 at a black panel temperature of 63±3° C. and a water spray time of 18 minutes for every 120 minutes of irradiation. Table 5 shows the 60° gloss retention (%), yellowing (ΔYI), and coloration (ΔE) after 2000 hours of testing.

In Examples 23 to 32, no tack was observed immediately after irradiation and high adhesion to various inorganic and organic substrates were exhibited. Hardness was also sufficient for handling. Particularly as for weather resistance, the compositions maintained high gloss retention, had very small changes in color tone and thus maintained the initial appearance even after a lapse of 2000 hours in the sunshine weatherometer. Also, as for re-coatability, good adhesion to the overcoat was observed and thus the compositions can also be used for primer coating. In Example 33 in which no component (D) was used, while high adhesion to various inorganic substrates was exhibited, tack occurred immediately after irradiation.

In Comparative Example 12 in which no component (B) was used, adhesion to inorganic substrates was reduced. Also, in Comparative Examples 13 and 14 in which no component (A) was used, not only was adhesion to inorganic and organic substrates reduced, but also weather resistance was greatly reduced and the coatings were cracked after a lapse of 1000 hours.

As described above, the active energy ray-curable resin compositions of the present invention containing: (A) a polymer having at least one group having a silicon atom bonded to a hydrolyzable group; (B) a specific silane compound; (C) a photoacid generator; (D) a compound having at least two (meth)acryloyl groups per molecule; and (E) a photoradical initiator were quickly cured by irradiation with active energy rays. Moreover, the compositions were found to be active energy ray-curable coating agents having very high adhesion to both inorganic and organic substrates and capable of directly coating organic and inorganic substrates, and to be usable as priming agents for organic-inorganic composite materials. Furthermore, they were also excellent in weather resistance and thus found to be coating agents suitable for use as topcoats on organic and inorganic substrates.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

INDUSTRIAL APPLICABILITY

The active energy ray-curable resin compositions according to one or more embodiments of the present invention can be used as protective coating agents for: cover glass and glass sensors for liquid crystal displays, plasma displays, and the like; displays of information and communication devices; glass for outdoor use; and window glass of buildings (e.g., public facilities, ordinary houses, and glass sided buildings), automobiles, and railway vehicles. The compositions can also be applied to metal and metal-deposited surfaces and used in pre-coated metal applications. The compositions can also be used as protective coating agents for organic substrates.

The invention claimed is:

1. An active energy ray-curable resin composition for coating inorganic substrates, the composition comprising:

100 parts by weight of (A) a polymer whose main chain is a (meth)acrylic copolymer and which has, at an end of the main chain and/or at a side chain, at least one group having a silicon atom bonded to a hydrolyzable group represented by a formula (I):

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and a represents an integer of 0 to 2;

0.1 to 20 parts by weight of (B1) a secondary and/or tertiary amino group-containing silane compound selected from the group consisting of bis(alkoxysilylalkyl)amine compounds, a reaction product of γ-glycidoxypropyltrimethoxysilane and N-(2-aminoethyl)-3-aminopropyltrimethoxysilane at a molar ratio of 2:1, and a reaction product of an epoxy resin, produced from bisphenol A resin and epichlorohydrin, and γ-aminopropyltriethoxysilane at a molar ratio of 1:2; and 0.05 to 20 parts by weight of (C) a photoacid generator.

2. The active energy ray-curable resin composition for coating inorganic substrates according to claim 1, wherein the silane compound (B1) is a bis(trialkoxysilylalkyl)amine compound.

3. The active energy ray-curable resin composition for coating inorganic substrates according to claim 1, further comprising:

0 to 100 parts by weight of (D) a compound having at least two (meth)acryloyl groups per molecule; and (E) a photoradical initiator in an amount of 0.05 to 50 parts by weight relative to 100 parts by weight of the component (D).

4. The active energy ray-curable resin composition for coating inorganic substrates according to claim 1, wherein the polymer (A) has, per molecule, three or more groups having a silicon atom bonded to a hydrolyzable group,
the photoacid generator (C) is an aromatic sulfonium salt or an aromatic iodonium salt, and
the photoacid generator (C) contains a fluorophosphate anion or a fluorosulfonate anion as a counter anion.

5. A method for producing a laminate, the method comprising:
applying the active energy ray-curable resin composition according to claim 1 to an inorganic substrate; and
curing the active energy ray-curable resin composition by irradiation with active energy rays to form a cured coating.

6. The method for producing a laminate according to claim 5, wherein the irradiation of active energy rays is carried out in the air.

7. A method for producing a pre-coated metal, the method comprising:
applying the active energy ray-curable resin composition according to claim 1 to an inorganic substrate; and
curing the active energy ray-curable resin composition by irradiation with active energy rays to form a cured coating.

8. A method for producing a glass material for information and communication devices, the method comprising:
applying the active energy ray-curable resin composition according to claim 1 to a glass substrate; and
curing the active energy ray-curable resin composition by irradiation with active energy rays to form a protective coating.

9. A laminate obtained by the production method according to claim 5, comprising a cured coating directly formed on a surface of an inorganic substrate, wherein the inorganic substrate is a transparent conductive film for use in touch panels of information and communication devices.

10. An inorganic substrate adhesion-improving composition for active energy ray-curable resins, the composition comprising:
(A) a polymer whose main chain is a (meth)acrylic copolymer and which has, at an end of the main chain and/or at a side chain, at least one group having a silicon atom bonded to a hydrolyzable group represented by a formula (I):

$$—SiR^2_a(OR^1)_{3-a} \quad (I)$$

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and a represents an integer of 0 to 2;

(B2) a silane compound selected from the group consisting of a reaction product of γ-glycidoxypropyltrimethoxysilane and N-(2-aminoethyl)-3-aminopropyltrimethoxysilane at a molar ratio of 2:1, a reaction product of an epoxy resin, produced from bisphenol A resin and epichlorohydrin, and γ-aminopropyltriethoxysilane at a molar ratio of 1:2, and a silane compound represented by a formula (II):

$$R^5N—\{X—SiR^4_b(OR^3)_{3-b}\}_2 \quad (II)$$

wherein X represents a divalent hydrocarbon group and may contain a nitrogen atom in its structure; $R^3$, $R^4$, and $R^5$ may be the same or different, and each represents a hydrogen atom or a C1-C10 alkyl group; and b represents an integer of 0 to 2; and
(C) a photoacid generator.

11. The inorganic substrate adhesion-improving composition according to claim 10, wherein the silane compound (B2) is a bis(trialkoxysilylalkyl)amine compound.

12. An inorganic substrate-adhesive active energy ray-curable resin composition, comprising:
the inorganic substrate adhesion-improving composition according to claim 10; and
a binder component, wherein
the binder component comprises (D) a compound having at least two (meth)acryloyl groups per molecule, and (E) a photoradical initiator,
the composition comprises, relative to 100 parts by weight of the component (D), 0.05 to 50 parts by weight of the component (E) and 10 to 100 parts by weight of the component (A), and
the composition comprises, relative to 100 parts by weight of the component (A), 0.1 to 100 parts by weight of the component (B2) and 0.05 to 20 parts by weight of the component (C).

13. The inorganic substrate-adhesive active energy ray-curable resin composition according to claim 12, wherein
the component (A) has, per molecule, three or more groups having a silicon atom bonded to a hydrolyzable group,
the component (C) is an aromatic sulfonium salt or an aromatic iodonium salt, and
the component (C) contains a fluorophosphate anion or a fluorosulfonate anion as a counter anion.

14. A method for producing a laminate, the method comprising:
applying the inorganic substrate-adhesive active energy ray-curable resin composition according to claim 12 to an inorganic substrate; and
curing the active energy ray-curable resin composition by irradiation with active energy rays to form a cured coating.

15. A laminate obtained by the production method according to claim 14, comprising a cured coating directly formed on a surface of an inorganic substrate.

16. An active energy ray-curable resin composition for coating organic and/or inorganic substrates, the composition comprising:
(A) a polymer whose main chain is a (meth)acrylic copolymer and which has, at an end of the main chain and/or at a side chain, at least one group having a silicon atom bonded to a hydrolyzable group represented by a formula (I):

$$—SiR^2_a(OR^1)_{3-a} \quad (I)$$

wherein $R^1$ represents a hydrogen atom or a C1-C10 alkyl group; $R^2$ represents a hydrogen atom or a monovalent hydrocarbon group selected from a C1-C10 alkyl group, a C6-C25 aryl group, and a C7-C12 aralkyl group; and a represents an integer of 0 to 2;

(B2) a silane compound selected from the group consisting of a reaction product of γ-glycidoxypropyltrimethoxysilane and N-(2-aminoethyl)-3-aminopropyltrimethoxysilane at a molar ratio of 2:1, a reaction product of an epoxy resin, produced from bisphenol A resin and epichlorohydrin, and γ-aminopropyltriethoxysilane at a molar ratio of 1:2, and a silane compound represented by a formula (II):

$$R^5N—\{X—SiR^4_b(OR^3)_{3-b}\}_2 \quad (II)$$

wherein X represents a divalent hydrocarbon group and may contain a nitrogen atom in its structure; $R^3$, $R^4$, and $R^5$ may be the same or different, and each represents a hydrogen atom or a C1-C10 alkyl group; and b represents an integer of 0 to 2;

(C) a photoacid generator;

(D) a compound having at least two (meth)acryloyl groups per molecule; and (E) a photoradical initiator.

17. The active energy ray-curable resin composition according to claim 16, wherein the silane compound (B2) is a bis(trialkoxysilylalkyl)amine compound.

18. The active energy ray-curable resin composition according to claim 16, wherein the composition comprises:

relative to 100 parts by weight of the component (A), 0.1 to 50 parts by weight of the component (B2), 0.05 to 20 parts by weight of the component (C), and 1 to 100 parts by weight of the component (D), 0.05 to 50 parts by weight of the component (E) relative to 100 parts by weight of the component (D), the component (A) has, per molecule, three or more groups having a silicon atom bonded to a hydrolyzable group, the component (C) is an aromatic sulfonium salt or an aromatic iodonium salt, and the component (C) contains a fluorophosphate anion or a fluorosulfonate anion as a counter anion.

19. A method for producing a laminate, the method comprising:

applying the active energy ray-curable resin composition according to claim 16 to an organic substrate and/or an inorganic substrate and/or an organic-inorganic composite substrate; and curing the active energy ray-curable resin composition by irradiation with active energy rays to form a cured coating.

20. A laminate obtained by the production method according to claim 19, comprising a cured coating directly formed on a surface of an organic inorganic substrate and/or an inorganic substrate and/or an organic-inorganic composite substrate.

21. The active energy ray-curable resin composition for coating inorganic substrates according to claim 1, wherein the bis(alkoxysilylalkyl)amine compound is at least one selected from the group consisting of bis(trimethoxysilylpropyl)amine, bis(triethoxysilylpropyl)amine, bis(methyldimethoxysilylpropyl)amine, bis(ethyldimethoxysilylpropyl)amine, bis(dimethylmethoxysilylpropyl)amine, bis(trimethoxysilylethyl)amine, bis(triethoxysilylethyl)amine, bis(trimethoxysilylmethyl)amine, and bis(triethoxysilylmethyl)amine.

22. The active energy ray-curable resin composition for coating inorganic substrates according to claim 1, wherein the bis(alkoxysilylalkyl)amine compound is at least one selected from the group consisting of bis(trimethoxysilylpropyl)amine and bis(triethoxysilylpropyl)amine.

* * * * *

UNITED STATES PATENT AND TRADEMARK OFFICE
CERTIFICATE OF CORRECTION

PATENT NO. : 10,131,810 B2
APPLICATION NO. : 14/905695
DATED : November 20, 2018
INVENTOR(S) : Youichi Matsuo et al.

Page 1 of 1

It is certified that error appears in the above-identified patent and that said Letters Patent is hereby corrected as shown below:

On the Title Page

Item (73) Assignee, the word "Kancka Corporation" should read -- Kaneka Corporation --.

Signed and Sealed this
Thirtieth Day of April, 2019

Andrei Iancu
*Director of the United States Patent and Trademark Office*